United States Patent
Snaith et al.

(10) Patent No.: US 10,079,320 B2
(45) Date of Patent: Sep. 18, 2018

(54) OPTOELECTRONIC DEVICE COMPRISING PEROVSKITES

(71) Applicant: ISIS INNOVATION LIMITED, Oxford (GB)

(72) Inventors: Henry Snaith, Oxfordshire (GB); Michael Lee, Oxfordshire (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 14/401,452

(22) PCT Filed: May 20, 2013

(86) PCT No.: PCT/GB2013/051310
§ 371 (c)(1),
(2) Date: Nov. 14, 2014

(87) PCT Pub. No.: WO2013/171520
PCT Pub. Date: Nov. 21, 2013

(65) Prior Publication Data
US 2015/0129034 A1    May 14, 2015

(30) Foreign Application Priority Data

May 18, 2012 (GB) .................................. 1208785.4
Jun. 13, 2012 (GB) .................................. 1210487.3

(51) Int. Cl.
*H01L 31/0264* (2006.01)
*H01L 51/42* (2006.01)
(Continued)

(52) U.S. Cl.
CPC ....... *H01L 31/0264* (2013.01); *H01G 9/2004* (2013.01); *H01L 51/4213* (2013.01);
(Continued)

(58) Field of Classification Search
CPC .................................................. H01L 31/0264
See application file for complete search history.

(56) References Cited

U.S. PATENT DOCUMENTS 5,721,634 A    2/1998 Rosker
5,871,579 A    2/1999 Liang et al.
(Continued)

FOREIGN PATENT DOCUMENTS

CN    1280394    1/2001
CN    101635203    9/2011
(Continued)

OTHER PUBLICATIONS

Lee et al., Efficient Hybrid Solar Cells Based on Meso-Superstructured Organometal Halide Perovskites, Nov. 2, 2012, Science, vol. 338, pp. 643-647.*
(Continued)

*Primary Examiner* — Devina Pillay
*Assistant Examiner* — Daniel P Malley, Jr.
(74) *Attorney, Agent, or Firm* — Kenneth H. Sonnenfeld; Bryte B. Kelly; King & Spalding LLP

(57) ABSTRACT

The invention provides an optoelectronic device comprising a porous material, which porous material comprises a semiconductor comprising a perovskite. The porous material may comprise a porous perovskite. Thus, the porous material may be a perovskite material which is itself porous. Additionally or alternatively, the porous material may comprise a porous dielectric scaffold material, such as alumina, and a coating disposed on a surface thereof, which coating comprises the semiconductor comprising the perovskite. Thus, in some embodiments the porosity arises from the dielectric scaffold rather than from the perovskite itself. The porous material is usually infiltrated by a charge transporting material such as a hole conductor, a liquid electrolyte, or an
(Continued)

electron conductor. The invention further provides the use of the porous material as a semiconductor in an optoelectronic device. Further provided is the use of the porous material as a photosensitizing, semiconducting material in an optoelectronic device. The invention additionally provides the use of a layer comprising the porous material as a photoactive layer in an optoelectronic device. Further provided is a photoactive layer for an optoelectronic device, which photoactive layer comprises the porous material.

39 Claims, 11 Drawing Sheets

(51) Int. Cl.
H01G 9/20 (2006.01)
H01L 31/0256 (2006.01)
(52) U.S. Cl.
CPC ....... H01L 51/4226 (2013.01); H01G 9/2036 (2013.01); H01L 51/422 (2013.01); H01L 2031/0344 (2013.01); H01L 2251/306 (2013.01); Y02E 10/549 (2013.01); Y02P 70/521 (2015.11)

(56) References Cited

U.S. PATENT DOCUMENTS

| | | | |
|---|---|---|---|
| 5,882,548 | A | 3/1999 | Liang |
| 6,150,536 | A | 11/2000 | Chondroudis et al. |
| 6,180,956 | B1 | 1/2001 | Chondroudis et al. |
| 6,281,429 | B1 | 8/2001 | Takada et al. |
| 6,429,318 | B1 | 8/2002 | Mitzi |
| 7,045,205 | B1 | 5/2006 | Sager |
| 2003/0010971 | A1 | 1/2003 | Zhang |
| 2005/0236033 | A1 | 10/2005 | Lawandy |
| 2006/0032529 | A1 | 2/2006 | Rand et al. |
| 2007/0007538 | A1 | 1/2007 | Ono et al. |
| 2007/0082227 | A1 | 4/2007 | Kobayashi et al. |
| 2007/0194311 | A1 | 8/2007 | Kojima et al. |
| 2008/0185037 | A1 | 8/2008 | Kim et al. |
| 2008/0202583 | A1 | 8/2008 | Lee |
| 2009/0032097 | A1 | 2/2009 | Bigioni et al. |
| 2010/0213440 | A1 | 8/2010 | Shieh et al. |
| 2010/0229949 | A1* | 9/2010 | Yamamoto ........... H01G 9/2031 136/261 |
| 2010/0294350 | A1 | 11/2010 | Ko et al. |
| 2011/0089402 | A1 | 4/2011 | Qi |
| 2011/0277818 | A1 | 11/2011 | Shimura |
| 2011/0287939 | A1 | 11/2011 | Goyal |
| 2012/0085396 | A1* | 4/2012 | Tsuda ................. H01G 9/2004 136/254 |
| 2013/0233377 | A1 | 9/2013 | Kanatzidis et al. |
| 2015/0034150 | A1 | 2/2015 | Snaith et al. |

FOREIGN PATENT DOCUMENTS

| | | |
|---|---|---|
| CN | 102468413 | 5/2012 |
| EP | 1207556 | 5/2002 |
| JP | 2004 134581 | 4/2004 |
| JP | 3 542 077 | 7/2004 |
| JP | 2007 031178 | 2/2007 |
| JP | 2008-189947 | 8/2008 |
| JP | 2010 009786 | 1/2010 |
| JP | 2011 076791 | 4/2011 |
| KR | 10-2003-0020854 | 3/2003 |
| KR | 10-2011-0076046 | 7/2011 |
| KR | 10-1172374 | 8/2012 |
| WO | WO 99/65085 | 12/1999 |
| WO | WO 2006/034561 | 4/2006 |
| WO | WO 2010/118321 | 10/2010 |
| WO | WO 2011/030117 | 3/2011 |
| WO | WO 2011/064601 | 6/2011 |
| WO | WO 2011/110869 | 9/2011 |
| WO | WO 2012/073010 | 6/2012 |
| WO | WO 2013/126537 | 8/2013 |
| WO | WO 2013/171517 | 11/2013 |
| WO | WO 2013/171518 | 11/2013 |

OTHER PUBLICATIONS

O'Regan et al., "A Solid-State Dye-Sensitized Solar Cell Fabricated with Pressure-Treated P25-TiO2 and CuSCN: Analysis of Pore filling and IV Characteristics", Chemical Materials, 2002, 14, pp. 5023-5029.*
Chung et al., "All-solid-state dye-sensitized solar cells with high efficiency", May 24, 2012, Nature, vol. 485, pp. 486-490.*
Snaith et al., "Charge collection and pore filling in solid-state dye-sensitized solar cells", 2008, Nanotechnology, 19, pp. 1-12.*
Lin et al., "Enhanced performance of dye-sensitized solar cells by an Al2O3 charge-recombination barrier formed by low-temperature atomic layer deposition", Mar. 17, 2009, Journals of Materials Chemistry, 19, pp. 2999-3003.*
Kitazawa et al., "Optical Properties of CH3NH3PbX3 (X=halogen) and their mixed-halide crystals", 2002, Journals of Materials Science, 37, pp. 3585-3587.*
Kojima et al., "Organometal Halide Perovskites as Visible-Light Sensitizers for Photovoltaic Cells", Apr. 14, 2009, Journal of American Chemical Society, 131, pp. 6050-6051.*
Yamada et al., "Tunable Perovskite Semiconductor CH3NH3SnX3 (X: Cl, Br, or I) Characterized by X-ray and DTA", , Aug. 27, 2011, The Chemical Society of Japan, vol. 84, pp. 926-932.*
Kojima et al., "Organonnetal Halide Perovskites as Visible-Light Sensitizers for Photovoltaic Cells", 2009, Journal of the American Chemical Society, 131, pp. 6050-6051. (Year: 2009).*
Aaron et al., "Device Characteristics of a 10.1% hydrazine-processed Cu2ZnSn(Se,S)4 Solar Cell," Progress in Photovoltaics: Research and Applications, 20, pp. 6-11, 2012.
Abrusci et al., "Facile Infiltration of Semiconducting Polymer into Mesoporous Electrodes for Hybrid Solar Cells," Energy Environ. Sci. 4, pp. 3051-3058, 2011.
Antila et al., "ALD Grown Aluminum Oxide Submonolayers in Dye-Sensitized Solar Cells: The Effect on Interfacial Electron Transfer and Performance," J. Phys. Chem. C, 115, pp. 16720-16729, 2011.
Bach et al., "Solid-State Dye-Sensitized Mesoporous TiO2 Solar Cells with High Photon-to-Electron Conversion Efficiencies," Nature 395, pp. 583-585, 1998.
Bogush, et al., "Preparation of Monodisperse Silica Particles: Control of Size and Mass Fraction," Journal of Non-Crystalline Solids, 104, pp. 95-106, 1988.
Brown et al., "Surface Energy Relay Between Cosensitized Molecules in Solid-State Dye-Sensitized Solar Cells," J. Phys. Chem. C, 115, pp. 23204-23208, 2011.
Burschka et al., "Tris(2-(1H-pyrazol-1-yl)pyridine)cobalt(III) as p-Type Dopant for Organic Semiconductors and Its Application in Highly Efficient Solid-State Dye-Sensitized Solar Cells," J. Am. Chem. Soc., 133 (45), pp. 18042-18045, 2011.
Chang et al., "Panchromatic Photon-Harvesting by Hole-Conducting Materials in Inorganic-Organic Heterojunction Sensitized-Solar Cell Through the Formation of Nanostructured Electron Channels, " Nano Lett. 12, pp. 1863-1867 2012.
Chondroudis et al., "Electroluminescence from an Organic-Inroganic Perovskite Incorporating a Quaterthiophene Dye Within Lead Halide Perovskite Layers," Chem. Mater., 11, pp. 3028-3030, 1999.
Chung et al, "All-Solid-State Dye-Sensitized Solar Cells with High Efficiency," Nature, vol. 485, pp. 486-489, 2012.
Dennler, et al., "Polymer-Fullerene Bulk-Heterojunction Solar Cells," Advanced Materials 21, pp. 1323-1338, 2009.
Ding et al., "Pore-Filling of Spiro-OMeTAD in Solid-State Dye Sensitized Solar Cells: Quantification, Mechanism, and Consequences for Device Performance," Adv. Funct. Mater. 19, pp. 2431-2436, 2009.

(56) References Cited

OTHER PUBLICATIONS

Era et al., "Organicinorganic Heterostructure Electroluminescent Device Using a Layered Perovskite Semiconductor," Appl. Phys. Lett., 65, pp. 676-678, 1994.

Era et al., "Polarized Electroluminescence from Oriented p-sexiphenyl Vacuum-deposited Film," Appl. Phys. Lett. 67(17), pp. 2436-2438, 1995.

Era et al., "Enhanced Phosphorescence from Naphthalene-Chromophore Incorporated into Lead Bromide-Based Layered Perovskite Having Organic-Inorganic Superlattice Structure," Chem. Phys. Lett. 296, pp. 417-420, 1998.

Era et al., "PbBr-Based Layer Perovskite Organic-Inorganic Superlattice Having Hole-Transporting Carbazole Chromophore in Organic Layer," Curr. Appl. Phys., 5, pp. 67-70, 2005.

Green et al., "Solar Cell Efficiency Tables (Version 38)," Prog. Photovolt: Res. Appl., 19, pp. 565-572, 2011.

Green, et al., "Solar Cell Efficiency Tables (version 39)," Progress in Photovoltaics: Research and Applications, 20, pp. 12-20, 2012.

Hagfeldt et al., "Light-Induced Redox Reactions in Nanocrystalline Systems," Chem. Rev., 95, pp. 49-68, 1995.

Halls, et al., "Efficient Photodiodes from Interpenerating Polymer Networks," Nature, 376, pp. 498-500, 1995.

Hines, et al., "Colloidal PbS Nanocrystals with Size-Tunable Near-Infrared Emission: Observation of Post-Synthesis Self-Narrowing of the Particle Size Distribution," Adv. Mater., 15(21), pp. 1844-1849, 2003.

Im, et al., "6.5% Efficient Perovskite Quantum-dot-Sensitized Solar Cell," Nanoscale 3, pp. 4088-4093, 2011.

Ishihara, "Optical Properties of PbI-based Perovskite Structures," Journal of Luminescence, 60&61, pp. 269-274, 1994.

Itzhaik, et al., "$Sb_2S_3$-Sensitized Nanoporous $TiO_2$ Solar Cells," J. Phys. Chem. C, 113, pp. 4254-4256, 2009.

Kagan, et al., "Organic-Inorganic Hybrid Materials as Semiconducting Channels in Thin-Film Field-Effect Transistors," Science 286, pp. 945-947, 1999.

Kavan, et al., "Highly Efficient Semiconducting $TiO_2$ Photoelectrodes Prepared by Aerosol Pyrolysis," Electrochim. Acta, 40, pp. 643-652, 1995.

Kay et al., "Artificial Photosynthesis. 2. Investigations on the Mechanism of Photsensitization of Nanocrystalline $TiO_2$ Solar Cells by Chlorophyll Derivatives," J. Phys. Chem., 98, pp. 952-959, 1994.

Kitazawa et al., "Optical Properties of $CH_3NH_3PbX_3$ (X=halogen) and Their Mixed-Halide Cystals," J. Mat Sci., 37, pp. 3585-3587, 2002.

Knop et al., "Alkylammonium Lead Halides. Part 2. $CH_3NH_3PbX_3$ (X=Cl, Br, I) Perovskites: Cuboctahedral Halide Cages with Isotropic Cation Reorientation," Can. J. Chem., 68, pp. 412-422, 1990.

Knutson et al., "Tuning the Band Gap in Hybrid Tin Iodide Perovskite Semiconductors Using Structural Templating," Inorg. Chem., 44, pp. 4699-4705, 2005.

Kojima et al., "Organometal Halide Perovskites as Visible-Light Sensitizers for Photovoltaic Cells," J. Am. Chem. Soc. 131, pp. 6050-6051, 2009.

Kojima et al, "Novel Photoelectrochemical Cell with Mesoscopic Electrodes Sensitized by Lead-Halide Compounds," 214th ECS Meeting, Abstract #27, downloaded on Nov. 30, 2015.

Koops et al., "Transient Emission Studies of Electron Injection in Dye Sensitised Solar Cells," Inorganica Chimica Acta, 361, pp. 663-670, 2008.

Koops et al., "Parameters Influencing the Efficiency of Electron Injection in Dye-Sensitized Solar Cells," JACS, 131(13), pp. 4808-4818, 2009.

Lee et al, "Efficient Hybrid Solar Cells Based on Meso-Superstructured Organometal Halide Perovskites", Science, vol. 338, pp. 643-647, 2012.

Lee et al., "Quantum-Dot-Sensitized Solar Cell Wth Uprecedentedly High Photocurrent," Scientific Reports, 3(1050), pp. 1-8, 2013.

Leijtens et al., "Hole Transport Materials with Low Glass Transition Temperatures and High Solubility for Application in Solid-State Dye-Sensitized Solar Cells," ACS Nano, 6(2), pp. 1455-1462, 2012.

Leventis et al., "Transient Optical Studies of Interfacial Charge Transfer at Nanostructured Metal Oxide/PbS Quantum Dot/Organic Hole Conductor Heterojunctions," JACS, 132, pp. 2743-2750, 2010.

Li et al., "Formability of $ABX_3$ (X=F, Cl, Br, I) Halide Perovskites," Acta Cryst., B64, pp. 702-707, 2008.

Lin et al., "Enhanced Performance of Dye-Sensitized Solar Cells by an $Al_2O_3$ Charge-Recombination Barrier Formed by Low-Temperature Atomic Layer Deposition," J. Mater. Chem., 19, pp. 2999-3003, 2009.

Martinson et al., "Radial Electron Collection in Dye-Sensitized Solar Cells," Nano Lett., vol. 8, No. 9, pp. 2862-2866, 2008.

Megaw, "Compounds of the Structural Type of Calcium Titanate," Nature 155, pp. 484-485, 1945.

Melas-Kyriazi et al., "The Effect of Hole Transport Material Pore Filling on Photovoltaic Performance in Solid-State Dye-Sensitized Solar Cells," Adv. Energy. Mater. 1, pp. 407-414, 2011.

Mitzi, "Synthesis, Structure, and Properties of Organic-Inorganic Perovskites and Related Materials," Prog. Inorg. Chem., 48, pp. 1-121, 1999.

Mitzi et al., "Design, Structure, and Optical Properties of Organic-Inorganic Perovskites Containing an Oligothiophene Chromophore," Inorg. Chem., 38, pp. 6246-6256, 1999.

Mitzi et al., "Conducting Tin Halides with a Layered Organic-Based Perovskite Structure," Nature., 369, pp. 467-469, 1994.

Mitzi et al., "Conducting Layered Organic-Inorganic Halides Containing <110>-Oriented Perovskite Sheets," Science., 267 (5203), pp. 1473-1476, 1995.

Mitzi et al., "High-Mobility Ultrathin Semiconducting Films Prepared by Spin Coating," Nature, 428, pp. 299-303, 2004.

O'Regan et al., "A Low-Cost, High-Efficiency Solar-Cell Based on Dye-Sensitized Colloidal TiO2 Films," Nature 353, pp. 737-740, 1991.

Palomares et al., "Slow Charge Recombination in Dye-Sensitised Solar Cells (DSSC) using $Al_2O_3$ Coated Nanoporous $TiO_2$ Films," Chemical Communications, pp. 1464-1465, 2002.

Peacock et al., "Band Offsets and Schottky Barrier Heights of High Dielectric Constant Oxides," J. Appl. Phys., vol. 92, No. 8, pp. 4712-4721, 2002.

Pernik et al., "Tracking the Adsorption and Electron Injection Rates of CdSe Quantum Dots on $TiO_2$: Linked Versus Direct Attachment," J. Phys. Chem. C, 115 (27), pp. 13511-13519, 2011.

Poglitsch et al., "Dynamic Disorder in Methylammoniumtrihalogenoplumbates (II) Observed by Millimeter-Wave Spectroscopy," J. Chem. Phys., 87(11), pp. 6373-6378, 1987.

Roelofs et al., "Effect of $Al_2O_3$ Recombination Barrier Layers Deposited by Atomic Layer Deposition in Solid State CdS Quantum Dot-Sensitized Solar Cells," J. Phys. Chem. C, 117, pp. 5584-5592, 2013.

Snaith et al., "The Role of a "Schottky Barrier" at an Electron-Collection Electrode in Solid-State Dye-Sensitized Solar Cells," Adv. Mater. 18, pp. 1910-1914, 2006.

Snaith et al., "Advances in Liquid-Electrolyte and Solid-State Dye-Sensitized Solar Cells," Advanced Materials, 19, pp. 3187-3200, 2007.

Snaith et al., "Charge Collection and Pore Filling in Solid-State Dye-Sensitized Solar Cells," Nanotechnology 19, pp. 424003-424015, 2008.

Snaith et al., "Charge Generation and Photovoltaic Operation of Solid-State Dye-Sensitized Solar Cells Incorporating a High Extinction Coefficient Indolene-Based Sensitizer," Adv. Func. Mater., 19, pp. 1-9, 2009.

Snaith, "Estimating the Maximum Attainable Efficiency in Dye-Sensitized Solar Cells," Adv. Funct. Mater. 20, pp. 13-19, 2010.

Sourisseau et al., "Hybrid Perovskite Resulting from the Solid-State Reaction between the Organic Cations and Perovskite Layers of $\alpha 1-(Br-(CH_2)_2-NH_3)_2PbI_4$," Inorg. Chem., 46, pp. 6148-6154, 2007.

Tang et al., "Colloidal-Quantum-dot Photovoltaics Using Atomic-Ligand Passivation," Nature Materials 10, pp. 765-771, 2011.

Todorov et al., "Efficiency Solar Cell with Earth-Abundant Liquid-Processed Absorber," Adv. Mater., 22, pp. E156-E159, 2010.

Tokito et al., "Structures and Optical Properties of Organic/Inorganic Superlattices," Appl. Phys. Lett. 64, pp. 1353-1355, 1994.

(56) References Cited

OTHER PUBLICATIONS

Vincent et al., "Alkylammonium Lead Halides. Part 1. Isolated $PbI_6^{4-}$ Ions in $(CH_3NH_3)_4PbI_6$ $2H_2O$)," Can. J. Chem., 65, pp. 1042-1046, 1987.
Yamada et al., "Tunable Perovskite Semiconductor $CH_3NH_3SnX_3$ (X: Cl, Br, or I) Characterized by X-ray and DTA," Bull. Chem. Soc. Jpn., 84(9), pp. 926-932, 2011.
Yan et al., "A High-Mobility Electron-Transporting Polymer for Printed Transistors," Nature, vol. 457, pp. 679-687, Feb. 2009.
Yella, et al., "Porphyrin-Sensitized Solar Cells with Cobalt (II/III)-Based Redox Electrolyte Exceed 12 Percent Efficiency," Science 334, pp. 629-634, 2011.
Yu, et al., "Polymer Photovoltaic Cells: Enhanced Efficiencies via a Network of Internal Donor-Acceptor Heterojunctions," Science 270, pp. 1789-1791, 1995.
Zhang et al,. "Dye-sensitized Solar Cells Made from $BaTiO_3$-coated $TiO_2$ Nanoporous Electrodes," Journal of Photochemistry and Photobiology A: Chemistry 197, pp. 260-265, 2008.
Experimental Annex "A", pp. 1-6, Filed with the European Patent Office on Sep. 1, 2014 in Response to the Written Opinion of the International Preliminary Examining Authority of PCT Application No. PCT/GB2013/051310 dated May 30, 2014.
Cheng et al., "Layered Organic-Inorganic Hybrid Perovskites:Structure, Optical Properties, Film Preparation, Patterning and Templating Engineering," *CrystEngComm*. 12: 2646-2662, 2010.
Hashmi et al., "Air Processed Inkjet Infiltrated Carbon Based Printed Perovskite Solar Cells with High Stability and Reproducibility," Adv. Mater. Technol. 1600183, pp. 1-6, 2016.
Hashmi et al., "Air Processed Inkjet Infiltrated Carbon Based Printed Perovskite Solar Cells with High Stability and Reproducibility," Adv. Mater. Technol. 1600183, 2016, Supporting information.
Kashiwamura et al., "Thin Films of Microcrystalline $(CH_3NH_3)$ $(C_6H_5C_2H_4NH_3)_2Pb_2Br_7$ and Related Compounds: Fabrication and Optical Properties," *Synthetic Metals*. 96(2): 133-136, 1998.
Kim, "Syntheses, Crystal Structures, and Dielectric Property of Oxynitride Perovskites," Dissertation, The Ohio State University, pp. 1-188, 2005.
Kitazawa, "Stability of $(C_6H_5C_2H_4NH_3)_2Pb(Br_xI_{4-x})$ Mixed Crystals," *Jpn. J. Appl. Phys*. 36: 6876-6879, 1997.
Kojima et al., "Organometal Halide Perovskites as Visible-Light Sensitizer for Photovoltaic Cells," *J. Am. Chem. Soc*. 131(17): 6050-6051, Supporting Information, 2009.
Liu et al., "Critical Parameters in $TiO_2/ZrO_2$/Carbon-Based Mesoscopic Perovskite Solar Cell," *Journal of Power Sources*. 293: 533-538, 2015.
Mitzi, "Solution-Processed Inorganic Semiconductors," *J. Mater. Chem*. 14: 2355-2365, 2004.
Miyasaka et al, "Lead Halide Perovskites as Quantum dot Sensitizers for Mesoscopic $TiO_2$ Photovoltaic Cells," *The Electrochemical Society Meeting Abstracts, 216th ECS Meeting* Abstract No. 742, 2009.
Papavassiliou, "Synthetic Three-And Lower-Dimensional Semiconductors Based on Inorganic Units," *Molecular crystals and liquid crystals science and technology. Section A. Molecular crystals and liquid crystals*. 286(1): 231-238, 1996.
Weber, "$CH_3NH_3PbX_3$, a Pb(II)-System with Cubic Perovskite Structure," Z. Naturforsch. 33b: 1443-1445, 1978, English Abstract only.
The Notice of Opposition filed in European Patent Application No. 13723943.0 by Oxford University Innovation Limited, pp. 1-32, Dec. 7, 2016.
Isis Innovation Limited, Notice of Non-Final Rejection for Korean Patent Application No. 10-2014-7035536, with English translation, dated Sep. 22, 2016, 9 pages.
Borriello et al., "Ab initio Investigation of Hybrid Organic-Inorganic Perovskites based on Tin Halides," Physical Review, B77, pp. 235214-1 through 235214-9, 2008.
Choi et al., "Structure of Methylammonium Lead Iodide Within Mesoporous Titanium Dioxide: Active Material in High-Performance Perovskite Solar Cells," Nano. Lett. 14, pp. 127-133, 2014.
Edri et al., "High Open-Circuit Voltage Solar Cells Based on Organic-Inorganic Lead Bromide Perovskite," J. Phys. Chem. Lett.,4, pp. 897-902, 2013.
Eperon et al., "Perovskite-perovskite tandem photovoltaics with optimized band gaps," Science, vol. 354, Issue 6314, pp. 861-865, 2016.
Jeon et al., "Solvent engineering for high-performance inorganic-organic hybrid perovskite solar cells", Nature Materials, 13, pp. 897-903, 2014.
Kim et al., "Lead Iodide Perovskite Sensitized All-Solid-State Submicron Thin Film Mesoscopic Solar Cell with Efficiency Exceeding 9%", Scientific Reports, 2:591, pp. 1-7, PMC. Web. May 8, 2017.
Liu et al., "Efficient planar heterojunction perovskite solar cells by vapour deposition", Nature, 501, pp. 395-398, 2013.
Mei et al., "A hole-conductor-free, fully printable mesoscopic perovskite solar cell with high stability", Science, 345, pp. 295-298, 2014.
Nirmala et al., "Synthesis and Characterization of Barium Titanate, Calcium Titanate and Strontium Titanate Thin Films," International Journal of Scientific & Engineering Research, 5(7), pp. 587-594, 2014, http://www.ijser.org/researchpaper%5CSynthesis-and-Characterization-of-Barium-Titanate-Calcium.pdf.
Noh et al., "Chemical Management for Colorful, Efficient, and Stable Inorganic-Organic Hybrid Nanostructured Solar Cells", Nano Lett., pp. A-F, 2013.
Planells et al., "Diacetylene bridged triphenylamines as hole transport materials for solid state dye sensitized solar cells," *Journals of Materials Chemistry A*. 1(23): 6949-6960, (2013).
Saliba et al., "Cesium-containing triple cation perovskite solar cells: improved stability, reproducibility and high efficiency", Energy Environ. Sci., 9, pp. 1989-1997, 2016.
Shockley et al., "Detailed Balance Limit of Efficiency of p-n Junction Solar Cells", Journal of Applied Physics 32(3), pp. 510-519, 1961.
Tamboli, Sikander, "Studies on Mechanical and Optical Properties of Magnesium Oxide, Aluminum Oxide and their co-deposited Mixed Thin Films—Chapter 4—Experimental Results of Aluminium Oxide ($Al_2O_3$) Thin Films," Kolhapur, pp. 145-169, 2012, http://shodhganga.inflibnet.ac.in/bitstream/10603/4037/10/10_chapter%204.pdf.
Wojciechowski et al., "Sub-150° C. processed meso-superstructured perovskite solar cells with enhanced efficiency", Energy Environ. Sci., 7, pp. 1-9, 2013.
Zhou et al., "Interface engineering of highly efficient perovskite solar cells", Science, 345, pp. 542-546, 2014.
Li et al., "New Organic-Inorganic Perovskite Materials With Different Optical Properties Modulated by Different Inorganic Sheets," Crystal Growth & Design, vol. 8, No. 6, 1990-1996, 2008.
Oxford University Innovation Limited, Extended European Search Report for European Patent Application No. 18155003.9, dated Mar. 27, 2018, 9 pages.
Smestad, "Testing of Dye Sensitized $TiO_2$ Solar Cells II: Theorectical Voltage Output and Photoluminescence Efficiencies," Solar Energy Materials and Solar Cells, 32, pp. 273-288, 1994.
Smestad et al., "Testing of Dye Sensitized $TiO_2$ Solar Cells I: Experimental Photocurrent Output and Conversion Efficiencies," Solar Energy Materials and Solar Cells, 32, pp. 259-272, 1994.
Smestad, "Absorptivity as a Predictor of the Photoluminescence Spectra of Silicon Solar Cells and Photosynthesis," Solar Energy Materials and Solar Cells, 38, pp. 57-71, 1995.
Oxford University Innovation Limited, Communication Pursuant to Article 94(3) EPC for EP 13766635.0, 6 pages, dated Sep. 28, 2017.
Hong et al., "Viability of Lead-Free Perovskites with Mixed Chalcogen and Halogen Anions for Photovoltaic Applications," The Journal of Physical Chemistry, 120, pp. 6435-6441, 2016.
Saparov et al., "Organic-Inorganic Perovskites: Structural Versatility for Functional Materials Design," Chemical Reviews, 116, pp. 4558-4596, 2016.

(56) References Cited

OTHER PUBLICATIONS

Oxford University Innovation Limited, Communication pursuant to Article 94(3) EPC for European Patent Application No. 15198085.1, dated Mar. 14, 2018, 6 pages.

Oxford University Innovation Limited, First Office Action from the State Intellectual Property Office of China for CN 201610597085.5, 11 pages, dated Apr. 13, 2018.

Kitazawa, N. et al., Optical properties of CH3NH3PbX3 (X=halogen) and their mixed-halide crystals, Journal of Materials Science, 2002, vol. 37, pp. 3585-3587.†

Kojima, A. et al., Organometal Halide Perovskites as Visible-Light Sensitizers for Photovoltaic Cells, J. Am. Chem. Soc., 2009, vol. 131, No. 17, pp. 6050-6051.†

Noh, J.H. et al., Chemical Management for Colorful, Efficient, and Stable Inorganic-Organic Hybrid Nanostructured Solar Cells, Nano Letters, 2013, vol. 13, No. 4, pp. 1764-1769.†

Kojima, A. et al., Novel Photoelectrochemical Cell with Mesoscopic Electrodes Sensitized by Lead-halide Compounds (11), 214th ECS Meeting, Abstract #27, The Electrochemical Society (Oct. 2008).†

\* cited by examiner
† cited by third party

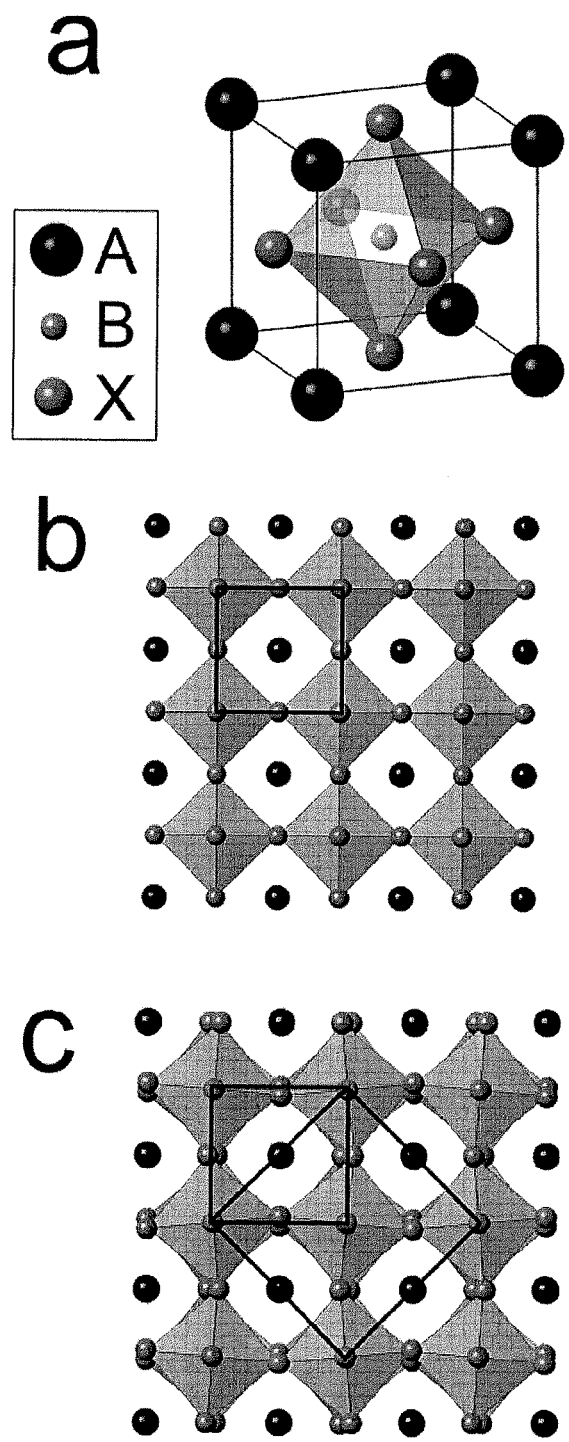
Figure 10 (a-c)

OPTOELECTRONIC DEVICE COMPRISING PEROVSKITES

FIELD OF THE INVENTION

The invention relates to optoelectronic devices, including photovoltaic devices.

BACKGROUND TO THE INVENTION

Over recent years, the field of optoelectronic devices has developed rapidly, generating new and improved devices that go some way to meeting the ever increasing global demand for low-carbon emissions. However, this demand cannot be met with the devices currently available. The issues with the currently-available technology are illustrated below, using the area of photovoltaic devices.

The leading emerging technologies pushing to realise the ultimate goal of low cost solar power generation are dye-sensitized and organic photovoltaics. Dye-sensitized solar cells are composed of a mesoporous n-type metal oxide photoanode, sensitized with organic or metal complex dye and infiltrated with a redox active electrolyte. [O'Regan, B. and M. Gratzel (1991). "A Low-Cost, High-Efficiency Solar-Cell Based On Dye-Sensitized Colloidal $TiO_2$ Films." Nature 353(6346): 737-740.] They currently have certified power conversion efficiencies of 11.4% [Martin A. Green et al. Prog. Photovolt: Res. Appl. 2011; 19:565-572] and highest reported efficiencies are 12.3% [Aswani Yella, et al. Science 334, 629 (2011)]. The current embodiment of organic solar cells, is a nanostructured composite of a light absorbing and hole-transporting polymer blended with a fullerene derivative acting as the n-type semiconductor and electron acceptor [Yu, G., J. Gao, et al. (1995) Science 270(5243): 1789-1791 and Halls, J. J. M., C. A. Walsh, et al. (1995) Nature 376(6540): 498-500]. The most efficient organic solar cells are now just over 10% [Green, M. A., K. Emery, et al. (2012). "Solar cell efficiency tables (version 39)." Progress in Photovoltaics 20(1): 12-20]. Beyond organic materials and dyes, there has been growing activity in the development of solution processable inorganic semiconductors for thin-film solar cells. Specific interest has emerged in colloidal quantum dots, which now have verified efficiencies of over 5%, [Tang, J, et al. Nature Materials 10, 765-771 (2011)] and in cheaply processable thin film semiconductors grown from solution such as copper zinc tin sulphide selenide (CZTSS) which has generated a lot of excitement recently by breaking the 10% efficiency barrier in a low cost fabrication route. [Green, M. A., K. Emery, et al. (2012). "Solar cell efficiency tables (version 39)." Progress in Photovoltaics 20(1): 12-20] The main issue currently with CZTSS system is that it is processed with hydrazine, a highly explosive reducing agent [Teodor K. Todorov et al. Adv. Matter 2010, 22, E156-E159].

For a solar cell to be efficient, the first requirement is that it absorbs most of the sun light over the visible to near infrared region (300 to 900 nm), and converts the light effectively to charge. Beyond this however, the charge needs to be collected at a high voltage in order to do useful work, and it is the generation of a high voltage with suitable current that is the most challenging aspect for the emerging solar technologies. A simple measure of how effective a solar cell is at generating voltage from the light it absorbs, is the difference energy between the optical band gap of the absorber and the open-circuit voltage generated by the solar cell under standard AM1.5G 100 mWcm$^{-2}$ solar illumination [H J Snaith et al. Adv. Func. Matter 2009, 19, 1-7]. For instance, for the most efficient single junction GaAs solar cells the open circuit voltage is 1.11 V and the band gap is 1.38 eV giving a "loss-in-potential" of approximately 270 meV [Martin A. Green et al. Prog. Photovolt: Res. Appl. 2011; 19:565-572]. For dye-sensitized and organic solar technologies these losses are usually on the order of 0.65 to 0.8 eV. The reason for the larger losses in the organics is due to a number of factors. Organic semiconductors used in photovoltaics are generally hindered by the formation of tightly bound excitons due to their low dielectric constants. In order to obtain effective charge separation after photoexcitation, the semiconducting polymer is blended with an electron accepting molecule, typically a fullerene derivative, which enables charge separation. However, in doing so, a significant loss in energy is required to do the work of separating the electron and hole. [Dennler, G., M. C. Scharber, et al. (2009). "Polymer-Fullerene Bulk-Heterojunction Solar Cells." Advanced Materials 21(13): 1323-1338] Dye-sensitized solar cells have losses, both due to electron transfer from the dye (the absorber) into the $TiO_2$ which requires a certain "driving force" and due to dye regeneration from the electrolyte which requires an "over potential". For dye-sensitized solar cells, moving from a multi-electron Iodide/triiodide redox couple to one-electron outer-sphere redox couples, such as a cobalt complexes or a solid-state hole-conductor, improves the issue but large losses still remain [Oregan 91, Aswani Yella, et al. Science 334, 629 (2011), and Bach 98 and Gratzel solid-state JACS]. There is an emerging area of "extremely thin absorber" solar cells which are a variation on the solid-state dye-sensitized solar cell. [Y. Itzhaik, O. Niitsoo, M. Page, G. Hodes, J. Phys. Chem. C 113, 4254-4256 (2009)] An extremely thin absorber (ETA) (few nm thick) layer is coated upon the internal surface of a mesoporous $TiO_2$ electrode, and subsequently contacted with a solid-state hole-conductor or electrolyte. These devices have achieved efficiencies of up to 7% for solid-state devices employing $Sb_2S_3$ as the absorber, [J. A. Chang et al., Nano Lett. 12, 1863-1867 (2012)] and up to 6.5% employing a lead-halide perovskite in photoelectrochemical solar cell. [A. Kojima, K. Teshima, Y. Shirai, T. Miyasaka, J. Am. Chem. Soc. 131, 6050-6051 (2009); J-H Im, C-R Lee, J-W Lee, S-W Park, N-G Park, Nanoscale 3, 4088-4093 (2011)] However, the ETA concept still suffer from rather low open-circuit voltages.

There is therefore a need for a new approach to developing optoelectronic devices. New systems that combine favourable properties such as high device efficiency and power conversion, with device stability are required. In addition, the devices should consist of inexpensive materials that may be easily tuned to provide the desirable properties and should be capable of being manufactured on a large scale.

SUMMARY OF THE INVENTION

The present inventors have provided optoelectronic devices which exhibit many favourable properties including high device efficiency. Record power conversion efficiencies as high as 10.9% have been demonstrated under simulated AM1.5 full sun light.

Other characteristics that have been observed in devices according to the invention are, for instance, surprisingly efficient charge collection and extremely high open-circuit voltages approaching 1.2 V. These devices show fewer fundamental loses than comparable devices currently on the market.

These advantages have been achieved using optoelectronic devices comprising a porous material, which porous material comprises a semiconductor comprising a perovskite. The perovskite-based semiconductor may itself be porous, or the porosity may arise from supporting the perovskite semiconductor on a porous dielectric scaffold material. Thus in some embodiments the porous material in the optoelectronic device comprises a porous semiconductor which is a porous perovskite. In other embodiments, the porous material comprises a porous dielectric scaffold material and a coating disposed on the surface thereof, which coating comprises a semiconductor comprising a perovskite. A charge transporting material is typically also employed, which infiltrates into the porous structure of the porous material so that it is in contact with the perovskite semiconductor. The perovskite typically acts as a light-absorbing, photosensitising material, as well as a charge transporting semiconductor. The material comprising the perovskite may therefore be referred to as the absorber. The porous nanostructure of the material comprising the perovskite helps to rapidly remove minority charge carriers (either holes or electrons) from the perovskite absorber, so that purely majority carriers (either electrons or holes, respectively) are present in the absorber. This overcomes the issue of short diffusion lengths which would arise if the semiconductor comprising the perovskite were employed in solid, thin-film form.

The materials used in the device of the invention are inexpensive, abundant and readily available and the individual components of the devices exhibit surprisingly stability. Further, the methods of producing the device are suitable for large-scale production.

For instance, in some embodiments the inventors have used a layered organometal halide perovskite as the absorber. The organometal halide perovskite is typically composed of very abundant elements. This material may be processed from a precursor solution via spin-coating in ambient conditions. In a solid-thin film form, it operates moderately well as a solar cell with a maximum efficiency of 2%. However, in order to overcome the issue of short diffusion lengths, the inventors have created the above-mentioned porous composites in order to remove the minority charge carriers (e.g. holes) from the absorber layer rapidly, so that purely majority carriers (e.g. electrons) are present in the perovskite absorber layer. In some embodiments the porous material is a mesoporous perovskite, whereas in other embodiments the porous material comprises a scaffold of a mesoporous insulating dielectric material, such as aluminium oxide, which is subsequently coated with a film of the perovskite. In either case a mesoporous perovskite electrode is realised. This may then be infiltrated with a charge transporting material, which is typically a p-type hole-conductor but could be an n-type electron-conductor, which acts as to carry the photoinduced holes or electrons, respectively, out of the device. This new architecture and material system has an optical band gap of 1.55 eV and generates up to 1.1 V open-circuit voltage under AM1.5G 100 mWcm$^{-2}$ sun light. This difference, which represents the fundamental loses in the solar cell, is only 0.45 eV, lower than any other emerging photovoltaic technology. The overall power conversion efficiency of 10.9% is also one of the highest reported, and represents the starting point for this exciting technology. With mind to the very low potential drop from band gap to open-circuit voltage, this concept has scope to become the dominating low cost solar technology.

Accordingly, the invention provides an optoelectronic device comprising a porous material, which porous material comprises a semiconductor comprising a perovskite, wherein the porous material comprises:

(a) a porous semiconductor which is a porous perovskite; or (b) a porous dielectric scaffold material and a coating disposed on the surface of said porous dielectric scaffold material, which coating comprises a semiconductor comprising a perovskite.

Typically, the porous material comprises a porous semiconductor which is a porous perovskite. Usually, in this embodiment, the porous material consists of said porous perovskite.

Additionally or alternatively, the porous material may comprise a porous dielectric scaffold material material and a coating disposed on the surface of said porous dielectric scaffold material, which coating comprises a semiconductor comprising a perovskite. Typically, in such embodiments, the semiconductor comprising the perovskite is disposed on the surface of said porous dielectric scaffold material. Thus, usually, the semiconductor comprising the perovskite is disposed on the surfaces of pores within said porous dielectric scaffold material.

In one embodiment, the optoelectronic device of the invention as defined above is an optoelectronic device which comprises a photoactive layer, wherein the photoactive layer comprises: (a) said porous material; and (b) a charge transporting material disposed within pores of said porous material. The charge transporting material may be an organic or inorganic hole conductor, a liquid electrolyte, or an electron transporting material.

The invention further provides the use of a porous material, which porous material comprises a perovskite, as a semiconductor in an optoelectronic device, wherein the porous material comprises:

(a) a porous perovskite; or (b) a porous dielectric scaffold material and a coating disposed on the surface of said porous dielectric scaffold material, which coating comprises a perovskite.

Further provided is the use of a porous material, which porous material comprises a perovskite, as a photosensitizing, semiconducting material in an optoelectronic device, wherein the porous material comprises:

(a) a porous perovskite; or (b) a porous dielectric scaffold material and a coating disposed on the surface of said porous dielectric scaffold material, which coating comprises a perovskite.

In another aspect, the invention provides the use of a layer comprising a porous material, which porous material comprises a semiconductor comprising a perovskite, as a photoactive layer in an optoelectronic device, wherein the porous material comprises:

(a) a porous semiconductor which is a porous perovskite; or (b) a porous dielectric scaffold material and a coating disposed on the surface of said porous dielectric scaffold material, which coating comprises a semiconductor comprising a perovskite.

In yet another aspect, the invention provides a photoactive layer for an optoelectronic device, which photoactive layer comprises a porous material, which porous material comprises a semiconductor comprising a perovskite, wherein the porous material comprises:

(a) a porous semiconductor which is a porous perovskite; or (b) a porous dielectric scaffold material and a coating disposed on the surface of said porous dielectric scaffold material, which coating comprises a semiconductor comprising a perovskite.

BRIEF DESCRIPTION OF THE FIGURES

FIG. 10(a-c) provides schematic diagrams of: (a) the general perovskite ABX$_3$ unit cell; (b) the cubic perovskite lattice structure (the unit cell is shown as an overlaid square); and (c) the tetragonal perovskite lattice structure arising from a distortion of the BX$_6$ octahedra (the unit cell is shown as the larger overlaid square, and the pseudocubic unit cell that it can be described by is shown as the smaller overlaid square).

DETAILED DESCRIPTION OF THE INVENTION

The invention provides an optoelectronic device comprising a porous material. which porous material comprises a semiconductor comprising a perovskite, wherein the porous material comprises:

(a) a porous semiconductor which is a porous perovskite; or (b) a porous dielectric scaffold material and a coating disposed on the surface of said porous dielectric scaffold material, which coating comprises a semiconductor comprising a perovskite.

Figure 1A:
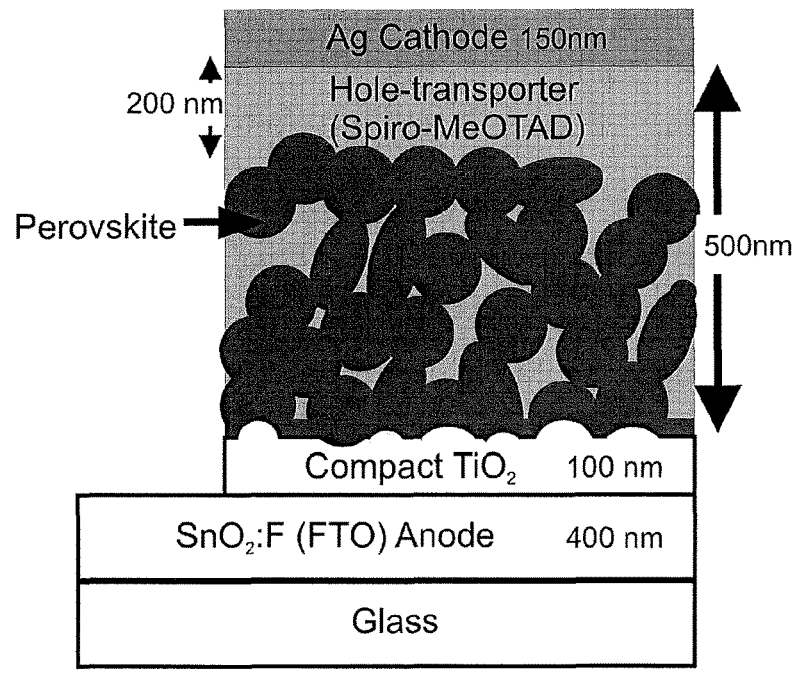
FIG. 1a is a schematic diagram of an embodiment of the optoelectronic device of the invention in which the porous material is a porous perovskite. In this embodiment, the perovskite semiconductor is itself porous. In the diagram shown, the porous perovskite is infiltrated by a molecular organic hole transporter, Spiro-MeOTAD.

In (a), the perovskite semiconductor is itself porous, whereas in (b) the porosity arises from supporting the perovskite semiconductor on a porous dielectric scaffold material. Embodiments of these different arrangements are shown schematically in FIGS. 1a and 1b respectively.

In some embodiments, the porous material in the optoelectronic device comprises (a) a porous semiconductor which is a porous perovskite.

In other embodiments, the porous material comprises (b) a porous dielectric scaffold material and a coating disposed on the surface of the porous dielectric scaffold material, which coating comprises a semiconductor comprising a perovskite.

As used herein, the term "porous" refers to a material within which pores are arranged. In a "porous dielectric scaffold material" the pores are volumes within the dielectric scaffold where there is no dielectric scaffold material. Similarly, in a "porous semiconductor which is a porous perovskite" the pores are volumes within the perovskite where there is no perovskite material. The individual pores may be the same size or different sizes. The size of the pores is defined as the "pore size". For spherical pores, the pore size is equal to the diameter of the sphere. For pores that are not spherical, the pore size is equal to the diameter of a sphere, the volume of said sphere being equal to the volume of the non-spherical pore.

The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.)

The skilled person is readily able to measure the band gap of a semiconductor, by using well-known procedures which do not require undue experimentation. For instance, the band gap of the semiconductor can be estimated by constructing a photovoltaic diode or solar cell from the semiconductor and determining the photovoltaic action spectrum. The monochromatic photon energy at which the photocurrent starts to be generated by the diode can be taken as the band gap of the semiconductor; such a method was used by Barkhouse et al., Prog. Photovolt: Res. Appl. 2012; 20:6-11. References herein to the band gap of the semiconductor mean the band gap as measured by this method, i.e. the band gap as determined by recording the photovoltaic action spectrum of a photovoltaic diode or solar cell constructed from the semiconductor and observing the monochromatic photon energy at which photocurrent starts to be generated.

The term "porous dielectric scaffold material", as used herein, therefore refers to a dielectric material which is itself porous, and which is capable of acting as a support for a further material such as said coating comprising said perovskite.

In some embodiments of the invention the perovskite-based semiconductor is itself porous. Thus, in some embodiments, the porous material in the optoelectronic device of the invention comprises (a) a porous semiconductor which is a porous perovskite. In these embodiments of the invention, (a), the porosity arises from the perovskite itself being porous, not for instance from the perovskite being supported on another, porous material. The (a) embodiments do not therefore encompass devices in which no porous perovskite is present, but instead only a non-porous perovskite is deposited onto a porous material, such as, for instance, porous titania.

Typically, in these embodiments of the invention, the porous material consists of a perovskite, i.e. the porous material consists of a porous perovskite.

The porous material in the optoelectronic device of the invention may be mesoporous. Thus, in some embodiments, the porous material in the optoelectronic device of the invention is a mesoporous perovskite.

The term "mesoporous", as used herein means that the pores in the porous structure are microscopic and have a size which is usefully measured in nanometres (nm). The mean pore size of the pores within a "mesoporous" structure may for instance be anywhere in the range of from 1 nm to 100 nm, or for instance from 2 nm to 50 nm. Individual pores may be different sizes and may be any shape.

The porosity of said porous material in the optoelectronic device of the invention is typically equal to or greater than 50%. The porosity may for instance be equal to or greater than 60%, or for example equal to or greater than 70%.

Thus, in some embodiments, the porous material in the optoelectronic device of the invention comprises a mesoporous perovskite, which has a porosity equal to or greater than 50%. The porosity of the mesoporous perovskite may for instance be equal to or greater than 60%, or for example equal to or greater than 70%.

As defined above, a porous material is material within which pores are arranged. The total volume of the porous material is the volume of the material plus the volume of the pores. The term "porosity", as used herein, is the percentage of the total volume of the material that is occupied by the pores. Thus if, for example, the total volume of the porous material was 100 $nm^3$ and the volume of the pores was 70 $nm^3$, the porosity of the material would be equal to 70%.

In other embodiments, the porosity arises from using a porous dielectric scaffold material coated with a semiconductor comprising a perovskite. Thus, the porous material may comprise a porous dielectric scaffold material and a coating disposed on the surface of said porous dielectric scaffold material, which coating comprises a semiconductor comprising a perovskite. In these embodiments, the perovskite may be non-porous (since porosity is provided anyway by the porous dielectric scaffold material). Alternatively, the perovskite may itself have a degree of porosity. The coating which comprises the perovskite is typically disposed on the surface of the porous dielectric scaffold material. Accordingly, as the skilled person will appreciate, this means that the semiconductor comprising the perovskite is usually coated on the inside surfaces of pores within the porous dielectric scaffold material, as well as on the outer surfaces of the scaffold material. This is shown schematically in FIG. 1a. The pores of the dielectric scaffold material are usually not completely filled by the semiconductor comprising the perovskite. Rather, the semiconductor is typically present as a coating on the inside surface of the pores. Thus, usually, the semiconductor comprising the perovskite is disposed on the surfaces of pores within the porous dielectric scaffold material.

The term "semiconductor" as used herein refers to a material with electrical conductivity intermediate in magnitude between that of a conductor and a dielectric. The perovskites used in the present invention are semiconductors. Typically, the perovskite used in the present invention is also a photosensitizing material, i.e. a material which is capable of performing both photogeneration and charge (electron or hole) transportation.

Typically, in the optoelectronic device of the invention the semiconductor comprising the perovskite is disposed on the surface of a porous dielectric scaffold material. Thus, typically, the porous material comprises a porous dielectric scaffold material and a coating disposed on the surface of said porous dielectric scaffold material, which coating comprises a semiconductor comprising a perovskite. Typically, the coating is disposed on the surfaces of pores within said porous dielectric scaffold material. As the skilled person will appreciate, the coating may be disposed on the surfaces of some or all pores within said dielectric scaffold material. The coating may consist of said semiconductor comprising a perovskite. Typically, the coating consists of said semiconductor which is a perovskite, i.e. the coating usually consists of said perovskite.

Typically, the dielectric scaffold material has a band gap of equal to or greater than 4.0 eV.

Usually, in the optoelectronic device of the invention, the dielectric scaffold material comprises an oxide of aluminium, zirconium, silicon, yttrium or ytterbium. For instance, the dielectric scaffold material may comprise zirconium oxide, silica, alumina, ytterbium oxide or yttrium oxide; or alumina silicate. Often, dielectric scaffold material comprises silica, or alumina. More typically, the dielectric scaffold material comprises porous alumina.

Typically, in the optoelectronic device of the invention, the dielectric scaffold material is mesoporous. Thus, typically, in the optoelectronic device of the invention, the dielectric scaffold material comprises mesoporous alumina.

The porosity of said dielectric scaffold material is usually equal to or greater than 50%. For instance, the porosity may be about 70%. In one embodiment, the porosity is equal to or greater than 60%, for instance equal to or greater than 70%.

Usually, in the optoelectronic device of the invention, the semiconductor comprising the perovskite is a photosensitizing material, i.e. it is capable of performing photogeneration as well as charge (electron or hole) transportation. Thus, typically, the perovskite employed is one which is a photosensitising material. The perovskites described herein are photosensitising materials as well as semiconductors.

The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprise more than one A cation, the different A cations may distributed over the A sites in an ordered or disordered way. When the perovskite comprise more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The perovskite employed in the optoelectronic device of the invention typically has a band gap of equal to or less than 2.8 eV. In some embodiments, the band gap of the perovskite is less than or equal to 2.5 eV. The band gap may for instance be less than or equal to 2.3 eV, or for instance less than or equal to 2.0 eV.

Usually, the band gap is at least 0.5 eV. Thus, the band gap of the perovskite may be from 0.5 eV to 2.8 eV. In some embodiments it is from 0.5 eV to 2.5 eV, or for example from 0.5 eV to 2.3 eV. The band gap of the perovskite may for instance be from 0.5 eV to 2.0 eV. In other embodiments, the band gap of the perovskite may be from 1.0 eV to 3.0 eV, or for instance from 1.0 eV to2.8 eV. In some embodiments it is from 1.0 eV to 2.5 eV, or for example from 1.0 eV to 2.3 eV. The band gap of the perovskite semiconductor may for instance be from 1.0 eV to 2.0 eV.

The band gap of the perovskite is more typically from 1.2 eV to 1.8 eV. The band gaps of organometal halide perovskite semiconductors, for example, are typically in this range and may for instance, be about 1.5 eV or about 1.6 eV. Thus, in one embodiment the band gap of the perovskite is from 1.3 eV to 1.7 eV.

As the skilled person will appreciate, the perovskite may be a perovskite which acts as an n-type, electron-transporting semiconductor when photo-doped. Alternatively, it may be a perovskite which acts as a p-type hole-transporting semiconductor when photo-doped. Thus, the perovksite may be n-type or p-type, or it may be an intrinsic semiconductor. Typically, the perovskite employed is one which acts as an n-type, electron-transporting semiconductor when photo-doped.

The optoelectronic device of the invention usually further comprises a charge transporting material disposed within pores of said porous material. The charge transporting material may be a hole transporting material or an electron transporting material. As the skilled person will appreciate, when the perovksite is an intrinsic semiconductor the charge transporting material can be a hole transporting material or an electron transporting material. However, when the perovskite is an n-type semiconductor, the charge transporting material is typically a hole transporting material. Also, when the perovskite is a p-type semiconductor, the charge transporting material is typically an electron transporting material.

Usually, in the optoelectronic device of the invention, the perovskite comprises at least one anion selected from halide anions and chalcogenide anions.

The term "halide" refers to an anion of a group 7 element, i.e., of a halogen. Typically, halide refers to a fluoride anion, a chloride anion, a bromide anion, an iodide anion or an astatide anion.

The term "chalcogenide anion", as used herein refers to an anion of a group 6 element, i.e. of a chalcogen. Typically, chalcogenide refers to an oxide anion, a sulphide anion, a selenide anion or a telluride anion.

In the optoelectronic device of the invention, the perovskite often comprises a first cation, a second cation, and said at least one anion.

As the skilled person will appreciate, the perovskite may comprise further cations or further anions. For instance, the perovskite may comprise two, three or four different first cations; two, three or four different second cations; or two, three of four different anions.

Typically, in the optoelectronic device of the invention, the second cation in the perovskite is a metal cation. More typically, the second cation is a divalent metal cation. For instance, the second cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the second cation is selected from $Sn^{2+}$ and $Pb^{2+}$.

In the optoelectronic device of the invention, the first cation in the perovskite is usually an organic cation.

The term "organic cation" refers to a cation comprising carbon. The cation may comprise further elements, for example, the cation may comprise hydrogen, nitrogen or oxygen.

Usually, in the optoelectronic device of the invention, the organic cation has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

As used herein, an alkyl group can be a substituted or unsubstituted, linear or branched chain saturated radical, it is often a substituted or an unsubstituted linear chain saturated radical, more often an unsubstituted linear chain saturated radical. A $C_1$-$C_{20}$ alkyl group is an unsubstituted or substituted, straight or branched chain saturated hydrocarbon radical. Typically it is $C_1$-$C_{10}$ alkyl, for example methyl, ethyl, propyl, butyl, pentyl, hexyl, heptyl, octyl, nonyl or decyl, or $C_1$-$C_6$ alkyl, for example methyl, ethyl, propyl, butyl, pentyl or hexyl, or $C_1$-$C_4$ alkyl, for example methyl, ethyl, i-propyl, n-propyl, t-butyl, s-butyl or n-butyl.

When an alkyl group is substituted it typically bears one or more substituents selected from substituted or unsubstituted $C_1$-$C_{20}$ alkyl, substituted or unsubstituted aryl (as defined herein), cyano, amino, $C_1$-$C_{10}$ alkylamino, di($C_1$-$C_{10}$)alkylamino, arylamino, diarylamino, arylalkylamino, amido, acylamido, hydroxy, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a $C_1$-$C_{20}$ alkyl group in which at least one hydrogen atom has been replaced with an aryl group. Examples of such groups include, but are not limited to, benzyl (phenylmethyl, $PhCH_2$—), benzhydryl ($Ph_2CH$—), trityl (triphenylmethyl, $Ph_3C$—), phenethyl (phenylethyl, $Ph$-$CH_2CH_2$—), styryl (Ph-CH=CH—), cinnamyl (Ph-CH=CH—$CH_2$—).

Typically a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from $C_1$-$C_6$ alkyl which is unsubstituted (to form an aralkyl group), aryl which is unsubstituted, cyano, amino, $C_1$-$C_{10}$ alkylamino, di($C_1$-$C_{10}$)alkylamino, arylamino, diarylamino, arylalkylamino, amido, acylamido, hydroxy, halo, carboxy, ester, acyl, acyloxy, $C_1$-$C_{20}$ alkoxy, aryloxy, haloalkyl, sulfhydryl (i.e. thiol, —SH), $C_{1-10}$ alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single $C_1$-$C_6$ alkylene group, or with a bidentate group represented by the formula —X—($C_1$-$C_6$)alkylene, or —X—($C_1$-$C_6$)alkylene-X—, wherein X is selected from O, S and NR, and wherein R is H, aryl or $C_1$-$C_6$ alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically it carries 0, 1, 2 or 3 substituents.

Mainly, in the optoelectronic device of the invention, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_{20}$ alkyl. For instance, $R_5$ may be methyl or ethyl. Typically, $R_5$ is methyl.

In some embodiments, the organic cation has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, $R_5$ in the organic cation is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

The organic cation may, for example, have the formula $(H_2N-CH-NH_2)^+$.

In one embodiment, the perovskite is a mixed-anion perovskite comprising a first cation, a second cation, and two or more different anions selected from halide anions and chalcogenide anions. For instance, the mixed-anion perovskite may comprise two different anions and, for instance, the anions may be a halide anion and a chalcogenide anion, two different halide anions or two different chalcogenide anions. The first and second cations may be as further defined hereinbefore. Thus the first cation may be an organic cation, which may be as further defined herein. For instance it may be a cation of formula $(R_1R_2R_3R_4N)^+$, or formula $(R_5NH_3)^+$, as defined above. Alternatively, the organic cation may be a cation of formula $[R_5R_6N=CH-NR_7R_8]^+$ as defined above. The second cation may be a divalent metal cation. For instance, the second cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the second cation is selected from $Sn^{2+}$ and $Pb^{2+}$.

In the optoelectronic device of the invention, the perovskite is usually a mixed-halide perovskite, wherein said two or more different anions are two or more different halide anions. Typically, they are two or three halide anions, more typically, two different halide anions. Usually the halide anions are selected from fluoride, chloride, bromide and iodide, for instance chloride, bromide and iodide.

Often, in the optoelectronic device of the invention, the perovskite is a perovskite compound of the formula (I):

$$[A][B][X]_3 \qquad (I)$$

wherein:

[A] is at least one organic cation;

[B] is at least one metal cation; and

[X] is said at least one anion.

For instance, the perovskite of formula (I) may comprise one, two, three or four different metal cations, typically one or two different metal cations. The perovskite of the formula (I), may, for instance, comprise one, two, three or four different organic cations, typically one or two different organic cations. The perovskite of formula (I), may, for instance, comprise one two, three or four different anions, typically two or three different anions.

The organic and metal cations may be as further defined hereinbefore. Thus the organic cations may be selected from cations of formula $(R_1R_2R_3R_4N)^+$ and cations of formula $(R_5NH_3)^+$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

The organic cation may, for instance, be selected from cations of formula $(R_5R_6N=CH-NR_7R_8)^+$, and cations of formula $(H_2N=CH-NH_2)^+$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

Typically, in the optoelectronic device of the invention, [X] in formula (I) is two or more different anions selected from halide anions and chalcogenide anions. More typically, [X] is two or more different halide anions.

In one embodiment, the perovskite is a perovskite compound of the formula (IA):

$$AB[X]_3 \quad (IA)$$

wherein:
A is an organic cation;
B is a metal cation; and
[X] is at least one anion.

Often, in the optoelectronic device of the invention, [X] in formula (IA) is two or more different anions selected from halide anions and chalcogenide anions. Usually, [X] is two or more different halide anions. Preferably, [X] is two or three different halide anions. More preferably, [X] is two different halide anions. In another embodiment [X] is three different halide anions.

The organic and metal cations may be as further defined hereinbefore. Thus the organic cation may be selected from cations of formula $(R_1R_2R_3R_4N)^+$ and cations of formula $(R_5NH_3)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $P^{2+}$, $Sn^{2+}$, $Yb^{2+}$ and $Eu^{2+}$. Usually, the metal cation is $Sn^{2+}$ or $Pb^{2+}$.

The organic cation may, for instance, be selected from cations of formula $(R_5R_6N=CH-NR_7R_8)^+$, and cations of formula $(H_2N=CH-NH_2)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

Typically, in the optoelectronic device of the invention, the perovskite is a perovskite compound of formula (II):

$$ABX_{3-y}X'_y \quad (II)$$

wherein:
A is an organic cation;
B is a metal cation;
X is a first halide anion;
X' is a second halide anion which is different from the first halide anion; and
y is from 0.05 to 2.95.

Usually, y is from 0.5 to 2.5, for instance from 0.75 to 2.25. Typically, y is from 1 to 2.

Again, the organic and metal cations may be as further defined hereinbefore. Thus the organic cation may be a cation of formula $(R_1R_2R_3R_4N)^+$ or, more typically, a cation of formula $(R_5NH_3)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the metal cation is $Sn^{2+}$ or $Pb^{2+}$.

In some embodiments, the perovskite is a perovskite compound of formula (IIa):

$$ABX_{3z}X'_{3(1-z)} \quad (IIa)$$

wherein:
A is an organic cation of the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl;
B is a metal cation;
X is a first halide anion;
X' is a second halide anion which is different from the first halide anion; and
z is greater than 0 and less than 1.

Usually, z is from 0.05 to 0.95.

Usually, z is from 0.1 to 0.9. z may, for instance, be 0.1, 0.2, 0.3, 0.4, 0.5, 0.6, 0.7, 0.8 or 0.9, or z may be a range of from any one of these values to any other of these values (for instance, from 0.2 to 0.7, or from 0.1 to 0.8).

Typically, X is a halide anion and X' is a chalcogenide anion, or X and X' are two different halide anions or two different chalcogenide anions. Usually, X and X' are two different halide anions. For instance, one of said two or more different halide anions may be iodide and another of said two or more different halide anions may be bromide.

Usually, B is a divalent metal cation. For instance, B may be a divalent metal cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, B is a divalent metal cation selected from $Sn^{2+}$ and $Pb^{2+}$. For instance, B may be $Pb^{2+}$.

The organic cation may, for instance, be $(R_5R_6N=CH-NR_7R_8)^+$, wherein: $R_5$, $R_6$, $R_7$ and $R_8$ are independently selected from hydrogen and unsubstituted or substituted $C_1$-$C_6$ alkyl. For instance, the organic cation may be $(H_2N=CH-NH_2)^+$.

Often, in the optoelectronic device of the invention, the perovskites are selected from $CH_3NH_3PbI_3$, $CH_3NH_3PbBr_3$, $CH_3NH_3PbCl_3$, $CH_3NH_3PbF_3$, $CH_3NH_3PbBd_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. For instance, in the optoelectronic device of the invention, the perovskites may be selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. Typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$. More typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$. Usually, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$.

In some embodiments, the perovskite may be a perovskite of formula $(H_2N=CH-NH_2)PbI_{3z}Br_{3(1-z)}$, wherein z is greater than 0 or less than 1. z may be as further defined hereinbefore.

The optoelectronic device of the invention may comprise said perovskite and a single-anion perovskite, for instance in a blend, wherein said single anion perovskite comprises a first cation, a second cation and an anion selected from halide anions and chalcogenide anions; wherein the first and second cations are as herein defined for said mixed-anion perovskite. For instance, the optoelectronic device may comprise: $CH_3NH_3PbICl_2$ and $CH_3NH_3PbI_3$; $CH_3NH_3PbICl_2$ and $CH_3NH_3PbBr_3$; $CH_3NH_3PbBrCl_2$ and $CH_3NH_3PbI_3$; or $CH_3NH_3PbBrCl_2$ and $CH_3NH_3PbBr_3$.

The optoelectronic device may comprise a perovskite of formula $(H_2N=CH-NH_2)PbI_{3z}Br_{3(1-z)}$, wherein z is as defined herein, and a single-anion perovskite such as $(H_2N=CH-NH_2)PbI_3$ or $(H_2N=CH-NH_2)PbBr_3$.

Alternatively, the optoelectronic device of the invention may comprise more than one perovskite, wherein each perovskite is a mixed-anion perovskite, and wherein said mixed-anion perovskite is as herein defined. For instance, the optoelectronic device may comprise two or three said perovskites. The optoelectronic device of the invention may, for instance, comprise two perovskites wherein both perovskites are mixed-anion perovskites. For instance, the optoelectronic device may comprise: $CH_3NH_3PbICl_2$ and $CH_3NH_3PbIBr_2$; $CH_3NH_3PbICl_2$ and $CH_3NH_3PbBrI_2$; $CH_3NH_3PbBrCl_2$ and $CH_3NH_3PbIBr_2$; or $CH_3NH_3PbBrCl_2$ and $CH_3NH_3PbIBr_2$.

The optoelectronic device may comprise two different perovskites, wherein each perovskite is a perovskite of formula $(H_2N=CH-NH_2)PbI_{3z}Br_{3(1-z)}$, wherein z is as defined herein.

In some embodiments of the optoelectronic device of the invention, when [B] is a single metal cation which is $Pb^{2+}$, one of said two or more different halide anions is iodide or fluoride; and when [B] is a single metal cation which is $Sn^{2+}$ one of said two or more different halide anions is fluoride. Usually, in some embodiments of the optoelectronic device of the invention, one of said two or more different halide anions is iodide or fluoride. Typically, in some embodiments of the optoelectronic device of the invention, one of said two or more different halide anions is iodide and another of said two or more different halide anions is fluoride or chloride. Often, in some embodiments of the optoelectronic device of the invention, one of said two or more different halide anions is fluoride. Typically, in some embodiments of the optoelectronic device of the invention, either: (a) one of said two or more different anions is fluoride and another of said said two or more different anions is chloride, bromide or iodide; or (b) one of said two or more different anions is iodide and another of said two or more different anions is fluoride or chloride. Typically, [X] is two different halide anions X and X'. Often, in the optoelectronic device of the invention, said divalent metal cation is $Sn^{2+}$. Alternatively, in the optoelectronic device of the invention, said divalent metal cation may be $Pb^{2+}$.

Usually, the optoelectronic device of the invention comprises a charge transporting material disposed within pores of said porous material, wherein the charge transporting material is an electron transporting material or a hole transporting material.

As the skilled person will appreciate, when the perovskite is an intrinsic semiconductor the charge transporting material can be a hole transporting material or an electron transporting material. However, when the perovskite is an n-type semiconductor, the charge transporting material is typically a hole transporting material. Also, when the perovskite is a p-type semiconductor, the charge transporting material is typically an electron transporting material. Any suitable hole transporting material or electron transporting material may be employed. The charge transporting material may be a liquid electrolyte.

Typically, the optoelectronic device of the invention further comprises a hole transporting material. The hole transporting material may comprise an organic hole transporting material. For instance, the hole transporting material may be a polymeric or molecular hole transporter.

The hole transporting material in the optoelectronic device of the invention may be any suitable p-type or hole-transporting, semiconducting material. The hole transporting material is usually a solid state hole transporting material or a liquid electrolyte. Often, the hole transporting material may comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). For instance, the hole transporting material may be HTM-TFSI or spiro-OMeTAD. Preferably, the hole transporting material is spiro-OMeTAD. Typically, in the optoelectronic device of the invention, the hole transporting material is a molecular hole conductor. Usually, in the optoelectronic device of the invention, the hole transporting material is selected from spiro-OMeTAD, P3HT, PCPDTBT and PVK. More typically, the hole transporting material is spiro-OMeTAD.

Alternatively, the hole transporting material may be an inorganic hole transporter, for example the hole transporting material selected from CuI, CuBr, CuSCN, $Cu_2O$, CuO or copper indium selenide (CIS).

The charge transporting material in the optoelectronic device of the invention may be an electron transporting material. Any suitable electron transporting material may be employed. For instance, the electron transporting material may comprise an organic electron transporting material. The electron transporting material may for instance comprise a fullerene or perylene, or P(NDI2OD-T2). P(NDI2OD-T2) is described in Yan et al., Nature, Vol 457, 5, February 2009, pp. 679-687.

In some embodiments, the perovskite of the porous material is a first perovskite, and the charge transporting material comprises a second perovskite, wherein the first and second perovskites are the same or different.

As described above, the first perovskite may have a band gap of equal to or less than 2.8 eV. The skilled person will appreciate that, when the first perovskite has a band gap of equal to or less than 2.8 eV, the second perovskite is not necessarily a perovskite that has a band gap of equal to or less than 2.8 eV. Thus the second perovskite may have a band gap of equal to or less than 2.8 eV or, in some embodiments, the second perovskite may have a band gap of greater than 2.8 eV.

The skilled person will also appreciate that, usually, either (i) the first perovskite is an n-type material and the second perovskite is a p-type material, or (ii) the first perovskite is a p-type material and the second perovskite is an n-type material. The skilled person will also appreciate that the addition of a doping agent to a perovskite may be used to control the charge transfer properties of that perovskite. Thus, for instance, a perovskite that is an instrinic material may be doped to form an n-type or a p-type material. Accordingly, the first perovskite and/or the second perovskite may comprise one or more doping agent. Typically the doping agent is a dopant element.

The addition of different doping agents to different samples of the same material may result in the different samples having different charge transfer properties. For instance, the addition of one doping agent to a first sample of perovskite material may result in the first sample becoming an n-type material, whilst the addition of a different doping agent to a second sample of the same perovskite material may result in the second sample becoming a p-type material.

In some embodiments of the optoelectronic device of the invention, the first and second perovskites may be the same.

Alternatively, the first and second perovskites may be different. When the first and second perovskites are different, at least one of the first and second perovskites may comprise a doping agent. The first perovskite may for instance comprise a doping agent that is not present in the second perovsite. Additionally or alternatively, the second perovskite may for instance comprise a doping agent that is not present in the first perovskite. Thus the difference between the first and second perovskites may be the presence or absence of a doping agent, or it may be the use of a different doping agent in each perovskite. Alternatively, the first and second perovskites may comprise the same doping agent. Thus the difference between the first and second perovskites may not lie in the doping agent but instead the difference may lie in the overall structure of the first and second perovskites. In other words, the first and second perovskites may be different perovskite compounds.

In one embodiment, when the charge transporting material is a hole transporting material, the perovskite of the porous material is a first perovskite, and the hole transporting material comprises a second perovskite, wherein the first and second perovskites are the same or different.

Likewise, when the charge transporting material is an electron transporting material, the perovskite of the porous material is a first perovskite, and the electron transporting material comprises a second perovskite, wherein the first and second perovskites are the same or different.

Usually, the first perovsite is a perovskite as defined hereinbefore.

Typically, the first and second perovskites are different.

Usually, in the optoelectronic device of the invention, the second perovskite is a perovskite comprising a first cation, a second cation, and at least one anion.

In some embodiments, the second perovskite is a perovskite compound of formula (IB):

$$[A][B][X]_3 \qquad (IB)$$

wherein:
[A] is at least one organic cation or at least one Group I metal cation;
[B] is at least one metal cation; and
[X] is at least one anion.

As the skilled person will appreciate, [A] may comprise $Cs^+$.

Usually, [B] comprises $Pb^{2+}$ or $Sn^{2+}$. More typically, [B] comprises $Pb^{2+}$.

Typically, [X] comprises a halide anion or a plurality of different halide anions.

Usually, [X] comprises $I^-$.

In some embodiments, [X] is two or more different anions, for instance, two or more different halide anions. For instance, [X] may comprise $I^-$ and $F^-$, $I^-$ and $Br^-$ or $I^-$ and $Cl^-$.

Usually, in the optoelectronic device of the invention, the perovskite compound of formula IB is $CsPbI_3$ or $CsSnI_3$. For instance, the perovskite compound of formula (IB) may be $CsPbI_3$.

Alternatively, the perovskite compound of formula (TB) may be $CsPbI_2Cl$, $CsPbICl_2$, $CsPbI_2F$, $CsPbIF_2$, $CsPbI_2Br$, $CsPbIBr_2$, $CsSnI_2Cl$, $CsSnICl_2$, $CsSnI_2F$, $CsSnIF_2$, $CsSnI_2Br$ or $CsSnIBr_2$. For instance, the perovskite compound of formula (TB) may be $CsPbI_2Cl$ or $CsPbICl_2$. Typically, the perovskite compound of formula (IB) is $CsPbICl_2$.

In the perovskite compound of formula (IB): [X] may be one, two or more different anions as defined herein, for instance, two or more different anions as defined herein for the first perovskite; [A] usually comprises an organic cation as defined herein, as above for the first perovskite; and [B] typically comprises a metal cation as defined herein. The metal cation may be defined as hereinbefore for the first perovskite.

In some embodiments, the second perovskite is a perovskite as defined for the first perovskite hereinabove. Again, the second perovskite may be the same as or different from the first perovskite, typically it is different.

Typically, the optoelectronic device of the invention comprises a layer comprising said porous material. Typically, the charge transporting material, when present, is disposed within pores of said porous material. Thus, when the optoelectronic device of the invention comprises a layer comprising said porous material, the layer usually further comprises said hole transporting material, within pores of the porous material.

Typically the optoelectronic device of the invention comprises a photoactive layer, wherein the photoactive layer comprises: said porous material. Usually, the photoactive layer comprises: said porous material; and
a charge transporting material disposed within pores of said porous material.

The charge transporting material in the photoactive layer may be as further defined hereinbefore.

The term "photoactive layer", as used herein, refers to a layer in the optoelectronic device which comprises a material that (i) absorbs light, which may then generate free charge carriers; or (ii) accepts charge, both electrons and holes, which may subsequently recombine and emit light.

Usually, the photoactive layer comprises a layer comprising said porous material, wherein said hole transporting material is disposed within pores of said porous material.

More typically, the photoactive layer comprises a layer comprising said charge transporting material disposed on a layer comprising said porous material, and said charge transporting material is also disposed within pores of said porous material.

In one embodiment, the optoelectronic device of the invention comprises:
a first electrode;
a second electrode; and disposed between the first and second electrodes:
said photoactive layer.

The first and second electrodes are an anode and a cathode, and usually one or both of the anode and cathode is transparent to allow the ingress of light. The choice of the first and second electrodes of the optoelectronic devices of the present invention may depend on the structure type. Typically, the first layer of the device is deposited onto the first electrode which comprises tin oxide, more typically onto a fluorine-doped tin oxide (FTO) anode, which is usually a transparent or semi-transparent material. Thus, the first electrode is usually transparent and typically comprises tin oxide, more typically fluorine-doped tin oxide (FTO). Usually, the thickness of the first electrode is from 200 nm to 600 nm, more typically from 300 to 500 nm. For instance the thickness may be 400 nm. Typically, FTO is coated onto a glass sheet. Usually, the second electrode comprises a high work function metal, for instance gold, silver, nickel, palladium or platinum, and typically silver. Usually, the thickness of the second electrode is from 50 nm to 250 nm, more usually from 100 nm to 200 nm. For instance, the thickness of the second electrode may be 150 nm.

As used herein, the term "thickness" refers to the average thickness of a component of an optoelectronic device.

Typically, in the optoelectronic device of the invention, the thickness of the photoactive layer is from 100 nm to 3000 nm, for instance from 200 nm to 1000 nm, or for instance the thickness may be from 400 nm to 800 nm. Often, thickness of the photoactive layer is from 400 nm to 600 nm. Usually the thickness is about 500 nm.

Usually, the optoelectronic device of the invention comprises:
a first electrode;
a second electrode; and disposed between the first and second electrodes:
(a) said photoactive layer; and
(b) a compact layer comprising a metal oxide.

As the skilled person will appreciate, when the perovskite semiconductor is n-type (for instance an n-type perovskite, or a perovskite which acts as an n-type, electron-transporting material when photo-doped) an n-type compact layer should also be used. On the other hand, when the semiconductor is p-type (for instance a p-type perovskite, or a perovskite which acts as a p-type, hole-transporting material when photo-doped), the compact layer should be p-type too. Examples of n-type semiconductors that can be used in the compact layer include oxides of titanium, tin, zinc, gallium, niobium, tantalum, neodinium, palladium and cadmium and sulphides of zinc or cadmium. Examples of p-type semiconductors that can be used in the compact layer include oxides of nickel, vanadium, or copper. Examples of materials which could be used as a compact layer when the perovskite semiconductor is p-type, are oxides of molybdenum and tungsten.

Usually, in the optoelectronic device of the invention, the compact layer is a compact layer of an n-type semiconductor. Typically, the compact layer comprises an oxide of titanium, tin, zinc, gallium, niobium, tantalum, tungsten, indium, neodinium, palladium or cadmium, or a sulphide of zinc or cadmium. More typically, the compact layer comprises $TiO_2$. Usually, the compact layer has a thickness of from 50 nm to 200 nm, typically a thickness of about 100 nm.

The optoelectronic device of the invention may further comprise an additional layer, disposed between the compact layer and the photoactive layer, which additional layer comprises a metal oxide or a metal chalcogenide which is the same as or different from the metal oxide or a metal chalcogenide employed in the compact layer. The additional layer may for instance comprises alumina, magnesium oxide, cadmium sulphide, yttrium oxide, or silicon dioxide.

Usually, the optoelectronic device of the invention is selected from a photovoltaic device; a photodiode; a phototransistor; a photomultiplier; a photo resistor; a photo detector; a light-sensitive detector; solid-state triode; a battery electrode; a light emitting device; a light emitting diode; a transistor; a solar cell; a laser; and a diode injection laser.

In a preferred embodiment, the optoelectronic device of the invention is a photovoltaic device, for instance a solar cell.

In another preferred embodiment, the optoelectronic device of the invention is a light-emitting device, for instance a light emitting diode.

For instance, in one embodiment the optoelectronic device of the invention is a photovoltaic device, wherein the device comprises:
a first electrode;
a second electrode; and disposed between the first and second electrodes:
a photoactive layer;
wherein the photoactive layer comprises a charge transporting material and a layer of a porous semiconductor which is a porous perovskite, wherein the porous perovskite is a photosensitizing material, and wherein the charge transporting material is disposed within pores of said porous perovskite;
wherein the perovskite is a perovskite compound of the formula (I):

$$[A][B][X]_3 \qquad (I)$$

wherein:
[A] is at least one organic cation;
[B] is at least one metal cation; and
[X] is at least one anion selected from halide anions and chalcogenide anions.

The organic and metal cations may be as further defined hereinbefore. Thus the organic cations may be selected from cations of formula $(R_1R_2R_3R_4N)^+$ and cations of formula $(R_5NH_3)^+$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. The metal cation in some embodiments comprises a tin cation, a lead cation or a copper cation, or more preferably a tin cation or a lead cation. Usually, the metal cation is $Sn^{2+}$ or $Pb^{2+}$.

The organic cations may, for instance, be selected from cations of formula $(R_5R_6N=CH-NR_7R_8)^+$ and cations of formula $(H_2N=CH-NH_2)^+$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. The metal cation in some embodiments comprises a tin cation, a lead cation or a copper cation, or more preferably a tin cation or a lead cation. Usually, the metal cation is $Sn^{2+}$ or $Pb^{2+}$.

[X] may also be as further defined herein. Usually, [X] is two or more different anions selected from halide anions and chalcogenide anions. More typically, [X] is two or more different halide anions.

The charge transporting material may also be as further defined herein.

In a further embodiment the optoelectronic device of the invention is a photovoltaic device, wherein the device comprises:
a first electrode;
a second electrode; and disposed between the first and second electrodes:
a photoactive layer;
wherein the photoactive layer comprises a charge transporting material and a layer of a porous material, which porous material comprises a porous dielectric scaffold material and a coating disposed on the surface of said porous dielectric scaffold material, wherein said coating is disposed on surfaces within pores of said porous dielectric scaffold material,
which coating comprises a semiconductor which is a perovskite, wherein the perovskite is a photosensitizing material,
wherein the charge transporting material is disposed within pores of said porous material; and
wherein the perovskite is a perovskite compound of the formula (I):

[A][B][X]$_3$     (I)

wherein:
[A] is at least one organic cation;
[B] is at least one metal cation; and
[X] is at least one anion selected from halide anions and chalcogenide anions.

The organic and metal cations may be as further defined hereinbefore. Thus the organic cations may be selected from cations of formula $(R_1R_2R_3R_4N)^+$ and cations of formula $(R_5NH_3)^+$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. The metal cation in some embodiments comprises a tin cation, a lead cation or a copper cation, or more preferably a tin cation or a lead cation. Usually, the metal cation is $Sn^{2+}$ or $Pb^{2+}$.

The organic cations may, for instance, be selected from cations of formula $(R_5R_6N\!=\!CH\!-\!NR_7R_8)^+$ and cations of formula $(H_2N\!=\!CH\!-\!NH_2)^+$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. The metal cation in some embodiments comprises a tin cation, a lead cation or a copper cation, or more preferably a tin cation or a lead cation. Usually, the metal cation is $Sn^{2+}$ or $Pb^{2+}$.

[X] may also be as further defined herein. Usually, [X] is two or more different anions selected from halide anions and chalcogenide anions. More typically, [X] is two or more different halide anions.

The porous dielectric scaffold material and the hole transporting material may also be as further defined herein.

The fundamental losses in a solar cell can be quantified as the difference in energy between the open-circuit voltage and the band-gap of the absorber, which may be considered the loss in potential. The theoretical maximum open-circuit voltage can be estimated as a function of band gap following the Schokley-Quasar treatment, and for a material with a band gap of 1.55 eV the maximum possible open-circuit voltage under full sun illumination is 1.3 V, giving a minimum loss-in-potential 0.25 eV.

Often, in the optoelectronic device of the invention, x is less than or equal to 0.5 eV, wherein:
x is equal to A–B,
wherein:
A is the optical band gap of said thin-film semiconductor; and
B is the open-circuit voltage generated by the optoelectronic device under standard AM1.5G 100 mWcm$^{-2}$ solar illumination.

Usually, in the optoelectronic device of the invention, x is less than or equal to 0.45 eV.

The invention also provides the of a porous material, which porous material comprises a perovskite, as a semiconductor in an optoelectronic device, wherein the porous material comprises:
(a) a porous perovskite; or
(b) a porous dielectric scaffold material and a coating disposed on the surface of said porous dielectric scaffold material, which coating comprises a perovskite.

Further provided is the use of a porous material, which porous material comprises a perovskite, as a photosensitizing, semiconducting material in an optoelectronic device, wherein the porous material comprises:
(a) a porous perovskite; or
(b) a porous dielectric scaffold material and a coating disposed on the surface of said porous dielectric scaffold material, which coating comprises a perovskite.

The invention also provides the use of a layer comprising a porous material, which porous material comprises a semiconductor comprising a perovskite, as a photoactive layer in an optoelectronic device, wherein the porous material comprises:
(a) a porous semiconductor which is a porous perovskite; or
(b) a porous dielectric scaffold material and a coating disposed on the surface of said porous dielectric scaffold material, which coating comprises a semiconductor comprising a perovskite. Usually the layer further comprises a charge transporting material as defined herein. The charge transporting material, where present, is typically disposed within pores of said porous material.

In the uses of the invention, the porous material and/or the optoelectronic device may be as further defined herein. The charge transporting material may also be as further defined herein.

Typically, in the uses of the invention, the optoelectronic device is a photovoltaic device.

The invention also provides a photoactive layer for an optoelectronic device, which photoactive layer comprises a porous material, which porous material comprises a semiconductor comprising a perovskite, wherein the porous material comprises:
(a) a porous semiconductor which is a porous perovskite; or
(b) a porous dielectric scaffold material and a coating disposed on the surface of said porous dielectric scaffold material, which coating comprises a semiconductor comprising a perovskite. Typically, the layer further comprises a charge transporting material. The charge transporting material, where present, is typically disposed within pores of said porous material.

The porous material and/or the optoelectronic device may be as further defined herein. The charge transporting material, when present, may also be as further defined herein.

The photoactive layer of the invention, or the photoactive layer present in the optoelectronic device of the invention, may further comprise encapsulated metal nanoparticles.

The porous dielectric scaffold material used in the devices of the invention can be produced by a process comprising: (i) washing a first dispersion of a dielectric material; and (ii) mixing the washed dispersion with a solution comprising a pore-forming agent which is a combustible or dissolvable organic compound. The pore-forming agent is removed later in the process by burning the agent off or by selectively dissolving it using an appropriate solvent. Any suitable pore-forming agent may be used. The pore-forming agent may be a carbohydrate, for instance a polysaccharide, or a derivative thereof. Typically, ethyl cellulose is used as the pore-forming agent.

The term "carbohydrate" refers to an organic compound consisting of carbon, oxygen and hydrogen. The hydrogen to oxygen atom ratio is usually 2:1. It is to be understood that the term carbohydrate encompasses monosaccharides, disaccharides, oligosaccharides and polysaccharides. Carbohydrate derivatives are typically carbohydrates comprising additional substituents. Usually the substituents are other than hydroxyl groups. When an carbohydrate is substituted it typically bears one or more substituents selected from substituted or unsubstituted $C_1$-$C_{20}$ alkyl, substituted or unsubstituted aryl, cyano, amino, $C_1$-$C_{10}$ alkylamino, di($C_1$-$C_{10}$)alkylamino, arylamino, diarylamino, arylalkylamino, amido, acylamido, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a $C_1$-$C_{20}$ alkyl group in which at least one hydrogen atom has been replaced with an aryl group. Examples of such groups include, but are not limited to, benzyl (phenylmethyl, $PhCH_2$—), benzhydryl ($Ph_2CH$—), trityl (triphenylmethyl, $Ph_3C$—), phenethyl (phenylethyl, $Ph$-$CH_2CH_2$—), styryl ($Ph$-$CH$=$CH$—), cinnamyl ($Ph$-$CH$=$CH$-$CH_2$—). In a carbohydrate derivative, the substituent on the carbohydrate may, for instance, be a $C_1$-$C_6$ alkyl, wherein a $C_1$-$C_6$ alkyl is as defined herein above. Often the substituents are substituents on the hydroxyl group of the carbohydrate. Typically, the pore-forming agent used in the step of mixing the dispersion with a solution is a carbohydrate or a derivative thereof, more typically a carbohydrate derivative. Thus, for instance, the carbohydrate or a derivative thereof is ethyl cellulose.

Usually, the first dispersion used in the process for producing the porous dielectric scaffold material is a solution comprising an electrolyte and water. Typically, the first dispersion is about 10 wt % of the electrolyte in water. For some dielectrics, for instance, silica, the process further comprises a step of forming the electrolyte from a precursor material. For instance, when the dielectric is silica, the process may further comprises a step of forming the electrolyte from a silicate, such as tetraethyl orthosilicate. Usually the precursor material is added to water. Typically, the first dispersion is produced by mixing an alcohol, such as ethanol, with water, then adding a base, such as ammonium hydroxide, in water and the precursor material. When the dielectric is silica, usually from 2 to 3 ml of deionized water are added to from 55 to 65 ml of absolute ethanol. Typically, about 2.52 ml of deionized water are added to about 59.2 ml of absolute ethanol.

This mixture is usually then stirred vigorously. Then, typically, from 0.4 to 0.6 ml of the base in water are added along with from 5 to 10 ml of the precursor. More typically, about 0.47 ml of ammonium hydroxide 28% in water are added along with about 7.81 ml of the precursor.

In the step of washing the first dispersion of a dielectric material often the first dispersion is centrifuged at from 6500 to 8500 rpm, usually at about 7500 rpm. Usually, the first dispersion is centrifuged for from 2 to 10 hours, typically for about 6 hours. The centrifuged dispersion is then usually redispersed in an alcohol, such as absolute ethanol. Often, the centrifuged dispersion is redispersed in an alcohol with an ultrasonic probe. The ultrasonic probe is usually operated for a total sonication time of from 3 minutes to 7 minutes, often about 5 minutes. Typically, the sonication is carried out in cycles. Usually, sonication is carried out in cycles of approximately 2 seconds on and approximately 2 seconds off. The step of washing the first dispersion is often repeated two, three or four times, typically three times.

Usually, in the step of mixing the washed dispersion with a solution comprising a pore-forming agent, such as a carbohydrate or a derivative thereof, the solution comprises a solvent for the pore-forming agent. For instance, when the pore-forming agent is ethyl cellulose, the solvent may be α-terpineol.

Typically, the amount of the product from the step of washing the first dispersion used in the step of mixing the washed dispersion with the solution is equivalent to using from 0.5 to 1.5 g of the dielectric, for instance, about 1 g of the dielectric. When the pore-forming agent is ethyl cellulose, usually, a mix of different grades of ethyl cellulose are used. Typically a ratio of approximately 50:50 of 10 cP:46 cP of ethyl cellulose is used. Usually, from 4 to 6 g of the carbohydrate or derivative is used. More usually, about 5 g of the carbohydrate or derivative is used. Typically the amount of solvent used is from 3 to 3.5 g, for instance 3.33 g.

Typically, in the step of mixing the washed dispersion with a solution comprising a pore-forming agent (e.g. a carbohydrate or a derivative thereof), each component is added in turn. Usually, after each component is added, the mixture is stirred for from 1 to 3 minutes, for instance, for 2 minutes. Often, after the mixture is stirred, it is sonicated with an ultrasonic probe for a total sonication time of from 30 to 90 seconds, often about 1 minute. Typically, the sonication is carried out in cycles. Usually, sonication is carried out in cycles of approximately 2 seconds on and approximately 2 seconds off.

Usually, in the step of mixing the washed dispersion with a solution comprising a pore-forming agent (e.g. a carbohydrate or a derivative thereof), after the components have been mixed, the resulting mixture is introduced into a rotary evaporator. The rotary evaporator is typically used to remove any excess alcohol, such as ethanol, and/or to achieve a thickness of solution appropriate for spin coating, doctor blading or screen printing the material.

The perovskite used in the devices of the invention, can be produced by a process comprising mixing:
(a) a first compound comprising (i) a first cation and (ii) a first anion; with
(b) a second compound comprising (i) a second cation and (ii) a second anion:
wherein:
the first and second cations are as defined herein; and
the first and second anions may be the same or different anions.

The perovskites which comprise at least one anion selected from halide anions and chalcogenide anions, may, for instance, be produced by a process comprising mixing:

(a) a first compound comprising (i) a first cation and (ii) a first anion; with (b) a second compound comprising (i) a second cation and (ii) a second anion:

wherein:

the first and second cations are as herein defined; and the first and second anions may be the same or different anions selected from halide anions and chalcogenide anions. Typically, the first and second anions are different anions. More typically, the first and second anions are different anions selected from halide anions.

The perovskite produced by the process may comprise further cations or further anions. For example, the perovskite may comprise two, three or four different cations, or two, three of four different anions. The process for producing the perovskite may therefore comprise mixing further compounds comprising a further cation or a further anion. Additionally or alternatively, the process for producing the perovskite may comprise mixing (a) and (b) with: (c) a third compound comprising (i) the first cation and (ii) the second anion; or (d) a fourth compound comprising (i) the second cation and (ii) the first anion.

Typically, in the process for producing the perovskite, the second cation in the mixed-anion perovskite is a metal cation. More typically, the second cation is a divalent metal cation. For instance, the first cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Y^{2+}$ and $Eu^{2+}$. Usually, the second cation is selected from $Sn^{2+}$ and $Pb^{2+}$.

Often, in the process for producing the perovskite, the first cation in the mixed-anion perovskite is an organic cation.

Usually, the organic cation has the formula $(R_1R_2R_3R_4N)^+$, wherein:

$R_1$ is hydrogen, or unsubstituted or substituted $C_1$-$C_{20}$ alkyl, or unsubstituted or substituted aryl;

$R_2$ is hydrogen, or unsubstituted or substituted $C_1$-$C_{20}$ alkyl, or unsubstituted or substituted aryl;

$R_3$ is hydrogen, or unsubstituted or substituted $C_1$-$C_{20}$ alkyl, or unsubstituted or substituted aryl; and $R_4$ is hydrogen, or unsubstituted or substituted $C_1$-$C_{20}$ alkyl, or unsubstituted or substituted aryl.

Mainly, in the organic cation, $R_1$ is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_{20}$ alkyl. For instance, $R_5$ may be methyl or ethyl. Typically, $R_5$ is methyl.

In some embodiments, the organic cation has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl. The organic cation may, for instance, be $(R_5R_6N=CH-NR_7R_8)^+$, wherein: $R_5$, $R_6$, $R_7$ and $R_8$ are independently selected from hydrogen, unsubstituted or substituted $C_1$-$C_{20}$ alkyl, and unsubstituted or substituted aryl. For instance, the organic cation may be $(H_2N=CH-NH_2)^+$.

In the process for producing the perovskite, the perovskite is usually a mixed-halide perovskite, wherein said two or more different anions are two or more different halide anions.

Typically, in the process for producing the perovskite, the perovskite is a perovskite compound of the formula (I):

$$[A][B][X]_3 \qquad (I)$$

wherein:

[A] is at least one organic cation;

[B] is at least one metal cation; and

[X] is said two or more different anions; and the process comprises mixing:

(a) a first compound comprising (i) a metal cation and (ii) a first anion; with (b) a second compound comprising (i) an organic cation and (ii) a second anion:

wherein:

the first and second anions are different anions selected from halide anions or chalcogenide anions.

Alternatively the process may comprising (1) treating: (a) a first compound comprising (i) a first cation and (ii) a first anion; with (b) a second compound comprising (i) a second cation and (ii) a first anion, to produce a first product, wherein: the first and second cations are as herein defined; and the first anion is selected from halide anions and chalcogenide anions; and (2) treating (a) a first compound comprising (i) a first cation and (ii) a second anion; with (b) a second compound comprising (i) a second cation and (ii) a second anion, to produce a second product, wherein: the first and second cations are as herein defined; and the second anion is selected from halide anions and chalcogenide anions. Usually, the first and second anions are different anions selected from halide anions and chalcogenide anions. Typically, the first and second anions are different anions selected from halide anions. The process usually further comprises treating a first amount of the first product with a second amount of the second product, wherein the first and second amounts may be the same or different.

The perovskite of the formula (I) may, for instance, comprise one, two, three or four different metal cations, typically one or two different metal cations. The perovskite of the formula (I), may, for instance, comprise one, two, three or four different organic cations, typically one or two different organic cations. The perovskite of the formula (I), may, for instance, comprise two, three or four different anions, typically two or three different anions. The process may, therefore, comprise mixing further compounds comprising a cation and an anion.

Typically, [X] is two or more different halide anions. The first and second anions are thus typically halide anions. Alternatively [X] may be three different halide ions. Thus the process may comprise mixing a third compound with the first and second compound, wherein the third compound comprises (i) a cation and (ii) a third halide anion, where the third anion is a different halide anion from the first and second halide anions.

Often, in the process for producing the perovskite, the perovskite is a perovskite compound of the formula (IA):

$$AB[X]_3 \qquad (IA)$$

wherein:

A is an organic cation;

B is a metal cation; and

[X] is said two or more different anions.

the process comprises mixing:
(a) a first compound comprising (i) a metal cation and (ii) a first halide anion; with
(b) a second compound comprising (i) an organic cation and (ii) a second halide anion:
wherein:
the first and second halide anions are different halide anions.

Usually, [X] is two or more different halide anions. Preferably, [X] is two or three different halide anions. More preferably, [X] is two different halide anions. In another embodiment [X] is three different halide anions.

Typically, in the process for producing the perovskite, the perovskite is a perovskite compound of formula (II):

$$ABX_{3-y}X'_{y} \qquad (II)$$

wherein:
A is an organic cation;
B is a metal cation;
X is a first halide anion;
X' is a second halide anion which is different from the first halide anion; and
y is from 0.05 to 2.95; and
the process comprises mixing:
(a) a first compound comprising (i) a metal cation and (ii) X; with
(b) a second compound comprising (i) an organic cation and (ii) X':
wherein the ratio of X to X' in the mixture is equal to (3−y):y.

In order to achieve said ratio of X to X' equal to (3−y):y, the process may comprise mixing a further compound with the first and second compounds. For example, the process may comprise mixing a third compound with the first and second compounds, wherein the third compound comprises (i) the metal cation and (ii) X'. Alternative, the process may comprising mixing a third compound with the first and second compounds, wherein the third compound comprises (i) the organic cation and (ii) X.

Usually, y is from 0.5 to 2.5, for instance from 0.75 to 2.25. Typically, y is from 1 to 2.

Typically, in the process for producing the perovskite, the first compound is $BX_2$ and the second compound is AX'.

Often the second compound is produced by reacting a compound of the formula ($R_5NH_2$), wherein: $R_5$ is hydrogen, or unsubstituted or substituted $C_1$-$C_{20}$ alkyl, with a compound of formula HX'. Typically, $R_5$ may be methyl or ethyl, often $R_5$ is methyl.

Usually, the compound of formula ($R_5NH_2$) and the compound of formula HX' are reacted in a 1:1 molar ratio. Often, the reaction takes place under nitrogen atmosphere and usually in anhydrous ethanol. Typically, the anhydrous ethanol is about 200 proof. More typically from 15 to 30 ml of the compound of formula ($R_5NH_2$) is reacted with about 15 to 15 ml of HX', usually under nitrogen atmosphere in from 50 to 150 ml anhydrous ethanol. The process may also comprise a step of recovering said mixed-anion perovskite. A rotary evaporator is often used to extract crystalline AX'.

Usually, the step of mixing the first and second compounds is a step of dissolving the first and second compounds in a solvent. The first and second compounds may be dissolved in a ratio of from 1:20 to 20:1, typically a ratio of 1:1. Typically the solvent is dimethylformamide (DMF) or water. When the metal cation is $Pb^{2+}$ the solvent is usually dimethylformamide. When the metal cation is $Sn^{2+}$ the solvent is usually water. The use of DMF or water as the solvent is advantageous as these solvents are not very volatile.

Often, in the process for producing the perovskite, the perovskite produced is a perovskite selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. More often, the perovskite is a perovskite selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. Typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$. More typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$. Usually, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$.

In some embodiments, in the process for producing the mixed-anion perovskite, the perovskite is a perovskite compound of formula (IIa):

$$ABX_{3z}X'_{3(1-z)} \qquad (IIa)$$

wherein:
A is an organic cation of the formula ($R_5R_6N=CH—NR_7R_8$)$^+$, wherein: (i) $R_5$ is hydrogen, unsubstituted or substituted $C_1$-$C_{20}$ alkyl, or unsubstituted or substituted aryl; (ii) $R_6$ is hydrogen, unsubstituted or substituted $C_1$-$C_{20}$ alkyl, or unsubstituted or substituted aryl; (iii) $R_7$ is hydrogen, unsubstituted or substituted $C_1$-$C_{20}$ alkyl, or unsubstituted or substituted aryl; and (iv) $R_8$ is hydrogen, unsubstituted or substituted $C_1$-$C_{20}$ alkyl, or unsubstituted or substituted aryl;
B is an metal cation selected from $Sn^{2+}$ and $Pb^{2+}$;
X is a first halide anion;
X' is a second halide anion which is different from the first halide anion; and
z is greater than 0 and less than 1;
and the process comprises:
(1) treating: (a) a first compound comprising (i) the metal cation and (ii) X, with (b) a second compound comprising (i) the organic cation and (ii) X, to produce a first product;
(2) treating: (a) a first compound comprising (i) the metal cation and (ii) X', with (b) a second compound comprising (i) the organic cation and (ii) X', to produce a second product; and
(3) treating a first amount of the first product with a second amount of the second product, wherein the first and second amounts may be the same or different.

Usually z is from 0.05 to 0.95.

In the process for producing a mixed-anion perovskite, the perovskite may, for instance, have the formula $(H_2N=CH—NH_2)PbI_{3z}Br_{3(1-z)}$, wherein z is as defined hereinabove.

The process for producing an optoelectronic device is usually a process for producing a device selected from: a photovoltaic device; a photodiode; a phototransistor; a photomultiplier; a photo resistor; a photo detector; a light-sensitive detector; solid-state triode; a battery electrode; a light emitting device; a light emitting diode; a transistor; a solar cell; a laser; and a diode injection laser. Typically, the optoelectronic device is a photovoltaic device, for instance a solar cell. In another preferred embodiment it is a light emitting device, for instance a light emitting diode.

The process for producing an optoelectronic device of the invention, wherein the optoelectronic device comprises:
a first electrode;
a second electrode; and disposed between the first and second electrodes:
(a) said photoactive layer; and
(b) a compact layer comprising a metal oxide.
is usually a process comprising:
(i) providing a first electrode;
(ii) depositing said photoactive layer;
(iii) depositing said compact layer; and
(iv) providing a second electrode.

The first and second electrodes are an anode and a cathode, one or both of which is transparent to allow the ingress of light. The choice of the first and second electrodes of the optoelectronic devices of the present invention may depend on the structure type. Typically, the compact layer is deposited onto a tin oxide, more typically onto a fluorine-doped tin oxide (FTO) anode, which is usually a transparent or semi-transparent material. Thus, the first electrode is usually transparent and typically comprises FTO. Usually, the thickness of the first electrode is from 200 nm to 600 nm, more usually, from 300 to 500 nm. For example the thickness may be 400 nm. Typically, FTO is coated onto a glass sheet. Often, the TFO coated glass sheets are etched with zinc powder and an acid to produce the required electrode pattern. Usually the acid is HCl. Often the concentration of the HCl is about 2 molar. Typically, the sheets are cleaned and then usually treated under oxygen plasma to remove any organic residues. Usually, the treatment under oxygen plasma is for less than or equal to 1 hour, typically about 5 minutes.

Usually, the second electrode comprises a high work function metal, for instance gold, silver, nickel, palladium or platinum, and typically silver. Usually, the thickness of the second electrode is from 50 nm to 250 nm, more usually from 100 nm to 200 nm. For example, the thickness of the second electrode may be 150 nm.

Usually, the compact layer of a semiconductor comprises a metal oxide or a metal sulphide as defined hereinbefore. Often, the compact layer is deposited on the first electrode. The process for producing the photovoltaic device thus usually comprises a step of depositing a compact layer of semiconductor comprising a metal oxide or a metal sulphide.

The step of depositing a compact layer comprising a metal oxide or a metal sulphide semiconductor may, for instance, comprise depositing the compact layer by aerosol spray pyrolysis deposition. In the case of titania, the aerosol spray pyrolysis deposition comprises deposition of a solution comprising titanium diisopropoxide bis(acetylacetonate), usually at a temperature of from 200 to 300° C., often at a temperature of about 250° C. Usually the solution comprises titanium diisopropoxide bis(acetylacetonate) and ethanol, typically in a ratio of from 1:5 to 1:20, more typically in a ratio of about 1:10.

Often, the step of depositing a compact layer comprises depositing a compact layer of said metal oxide or a metal sulphide semiconductor to a thickness of from 50 nm to 200 nm, typically a thickness of about 100 nm.

The photoactive layer usually comprises: (a) said porous material; and (b) said charge transporting material.

When the porous material comprises a porous dielectric scaffold material and a coating disposed on the surface of said porous dielectric scaffold material, which coating comprises a semiconductor comprising a perovskite, the step of depositing the photoactive layer typically comprises: (i) depositing the porous dielectric scaffold material; (ii) depositing the semiconductor comprising said perovskite; and (iii) depositing the charge transporting material. More typically, the step of depositing the photoactive layer comprises: (i) depositing the porous dielectric scaffold material; then (ii) depositing the semiconductor comprising said perovskite; and then (iii) depositing the charge transporting material.

The porous dielectric scaffold material is typically deposited onto a compact layer which comprises a metal oxide or metal sulphide, as defined hereinbefore. Usually, the porous dielectric scaffold material is deposited onto the compact layer comprising a metal oxide using a method selected from screen printing, doctor blade coating and spin-coating. As the skilled person will appreciate: (i) the method of screen printing usually requires the deposition to occur through a suitable mesh; (ii) if doctor blade coating is used, a suitable doctor blade height is usually required; and (iii) when spin-coating is used, a suitable spin speed is needed.

The porous dielectric scaffold material is often deposited with a thickness of between 100 to 1000 nm, typically 200 to 500 nm, and more typically about 300 nm.

After the porous dielectric scaffold material has been deposited, the material is usually heated to from 400 to 500° C., typically to about 450° C. Often, the material is held at this temperature for from 15 to 45 minutes, usually for about 30 minutes. This dwelling step is usually used in order to degrade and remove the pore-forming material from within the pores of the scaffold material. For instance, the dwelling step may be used to remove ethyl cellulose from the pores.

In the step of depositing the perovskite, said perovskite is a perovskite as described herein. The step of depositing the perovskite usually comprises depositing the perovskite on the porous dielectric scaffold material. Often, the step of depositing the perovskite comprises spin coating said perovskite. The spin coating usually occurs in air, typically at a speed of from 1000 to 2000 rpm, more typically at a speed of about 1500 rpm and/or often for a period of from 15 to 60 seconds, usually for about 30 seconds. The perovskite is usually placed in a solvent prior to the spin coating. Usually the solvent is DMF (dimethylformamide) and typically the volume of solution used is from 1 to 200 µl, more typically from 20 to 100 µl. The concentration of the solution is often of from 1 to 50 vol % perovskite, usually from 5 to 40 vol %. The solution may be, for instance, dispensed onto the porous dielectric scaffold material prior to said spin coating and left for a period of about 5 to 50 second, typically for about 20 seconds. After spin coating the perovskite is typically placed at a temperature of from 75 to 125° C., more typically a temperature of about 100° C. The perovskite is then usually left at this temperature for a period of at least 30 minutes, more usually a period of from 30 to 60 minutes. Often, the perovskite is left at this temperature for a period of about 45 minutes. Typically, the perovskite will change colour, for example from light yellow to dark brown. The colour change may be used to indicate the formation of the perovskite layer. Usually, at least some of the perovskite, once deposited, will be in the pores of the porous dielectric scaffold material.

Usually, the perovskite does not decompose when exposed to oxygen or moisture for a period of time equal to or greater than 10 minutes. Typically, the perovskite does not decompose when exposed to oxygen or moisture for a period of time equal to or greater than 24 hours.

Often the step of depositing the perovskite, may comprise depositing said perovskite and a single-anion perovskite, wherein said single anion perovskite comprises a first cation, a second cation and an anion selected from halide anions and chalcogenide anions; wherein the first and second cations are as herein defined for said mixed-anion perovskite. For instance, the photoactive layer may comprise: $CH_3NH_3PbICl_2$ and $CH_3NH_3PbI_3$; $CH_3NH_3PbICl_2$ and $CH_3NH_3PbBr_3$; $CH_3NH_3PbBrCl_2$ and $CH_3NH_3PbI_3$; or $CH_3NH_3PbBrCl_2$ and $CH_3NH_3PbBr_3$.

Alternatively, the step of depositing the perovskite, may comprise depositing more than one perovskite, wherein each perovskite is a mixed-anion perovskite, and wherein said mixed-anion perovskite is as herein defined. For instance, the photoactive layer may comprise two or three said perovskites. The photoactive layer may comprise two perovskites wherein both perovskites are mixed-anion perovskites. For instance, the photoactive layer may comprise: $CH_3NH_3PbICl_2$ and $CH_3NH_3PbIBr_2$; $CH_3NH_3PbICl_2$ and $CH_3NH_3PbBrI_2$; $CH_3NH_3PbBrCl_2$ and $CH_3NH_3PbIBr_2$; or $CH_3NH_3PbBrCl_2$ and $CH_3NH_3PbIBr_2$.

As a further alternative, the step of depositing a sensitizer comprising said perovskite, may comprise depositing at least one perovskite, for instance, at least one perovskite having the formula $(H_2N=CH—NH_2)PbI_{3z}Br_{3(1-z)}$, wherein z is as defined herein.

When the porous material comprises a porous n-type semiconductor comprising a perovskite, i.e. when the porous material comprises a perovskite which is itself porous, the step of depositing the photoactive layer typically comprises: (i) depositing a porous semiconductor comprising a perovskite; and (ii) depositing the charge transporting material. More typically, the step of depositing the photoactive layer comprises: (i) depositing the porous semiconductor comprising the perovskite; and then (ii) depositing the charge transporting material.

The step of depositing a porous semiconductor comprising a perovskite usually comprises depositing a solution of a perovskite and a pore-forming agent, forming a perovskite containing a pore-forming agent, and then removing the pore-forming agent to form a porous perovskite. Any suitable pore-forming agent may be used. The pore-forming agent may be a carbohydrate, for instance a polysaccharide, or a derivative thereof. Typically, ethyl cellulose is used as the pore-forming agent. The solution may comprise, for instance a 3:1 mass ratio of the perovskite to the pore forming agent. Typically, the porous perovskite is deposited onto the compact layer comprising a metal oxide. Often, the step of depositing the porous perovskite comprises spin coating. The spin coating usually occurs in air, typically at a speed of from 1000 to 2000 rpm, more typically at a speed of about 1500 rpm and/or often for a period of from 15 to 60 seconds, usually for about 30 seconds. After spin coating the perovskite is typically placed at a temperature of from 75° C. to 125° C., more typically a temperature of about 100° C. The perovskite is then usually left at this temperature for a period of at least 30 minutes, more usually a period of from 30 to 60 minutes, to dry the film and form the perovskite. Often, the perovskite is left at this temperature for a period of about 45 minutes. Subsequently the film is rinsed in a solvent which selectively washes out the pore-forming agent, to leave a porous perovskite film. Any suitable solvent may be used. For instance, when the pore-forming agent is ethyl cellulose, toluene is a suitable solvent for selectively dissolving the ethyl cellulose. The film is typically then reheated to dry out any residual solvent, and then cooled. When toluene is the solvent, the film is typically reheated to around 100° C. for a suitable period of time, for instance for about 10 minutes.

The step of depositing a charge transporting material usually comprises depositing a charge transporting material that is a solid state hole transporting (p-type) material or a liquid electrolyte. Alternatively, the step of depositing a charge transporting material may comprise depositing an electron transporting (n-type) material. The charge transporting material in the optoelectronic device of the invention may be any suitable p-type or hole-transporting, semiconducting material or any suitable n-type or electron-transporting, semiconducting material. The hole transporting material may comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). For instance, the hole transporting material may be HTM-TFSI or spiro-OMeTAD. Preferably, the hole transporting material is spiro-OMeTAD. Alternatively, the hole transporting material may be an inorganic hole transporter, for example the hole transporting material selected from CuI, CuBr, CuSCN, $Cu_2O$, CuO and CIS. The electron transporting material may for instance comprises a fullerene or perylene, or P(NDI2OD-T2).

Prior to the step of depositing a charge transporting material, the charge transporting material is often dissolved in a solvent. For instance, spiro-OMeTAD is usefully dissolved in chlorobenzene. Usually the concentration of cholorbenzene is from 150 to 225 mg/ml, more usually the concentration is about 180 mg/ml. Typically, in this case, the charge transporting material is dissolved in the solvent at a temperature of from 75 to 125° C., more typically at a temperature of about 100° C. Usually, it is dissolved for a period of from 25 minutes to 60 minutes, more usually a period of about 30 minutes. An additive may be added to the charge transporting material. The additive may be, for instance, tBP, Li-TFSi, an ionic liquid or an ionic liquid with a mixed halide(s).

The charge transporting material may be a hole transporting material, for instance spiro-OMeTAD. Often, tBP is also added to the hole transporting material prior to the step of depositing a hole transporting material. For instance, tBP may be added in a volume to mass ratio of from 1:20 to 1:30 μl/mg tBP:spiro-OMeTAD. Typically, tBP may be added in a volume to mass ratio of about 1:26 μl/mg tBP:spiro-OMeTAD. Additionally or alternatively, Li-TFSi may be added to the hole transporting material prior to the step of depositing a hole transporting material. For instance, Li-TFSi may be added at a ratio of from 1:5 to 1:20 μl/mg Li-TFSi:spiro-OMeTAD. Usually Li-TFSi may be added at a ratio of about 1:12 μl/mg Li-TFSi:spiro-OMeTAD.

The step of depositing a charge transporting material often comprises spin coating a solution comprising the charge transporting material onto the sensitizer comprising said perovskite. Usually, prior to spin coating, a small quantity of the solution comprising the charge transporting material is deposited onto the sensitizer comprising said perovskite. The small quantity may for instance be from 5 to 100 μl, more usually from 20 to 70 μl. The solution comprising the charge transporting material is typically left for a period of at least 5 seconds, more typically a period of from 5 to 60 seconds, prior to spin coating. For instance, the solution comprising the charge transporting material be left for a period of about 20 seconds prior to spin coating. The spin coating of the charge transporting material is usually carried out at from 500 to 3000 rpm, typically at about 1500 rpm. The spin coating is often carried our for from 10 to 40 seconds in air, more often for about 25 seconds.

The step of producing a second electrode usually comprises a step of depositing the second electrode on to the charge transporting material. Typically, the second electrode is an electrode comprising silver. Often, the step of producing a second electrode comprises placing a film comprising the charge transporting material in a thermal evaporator. Usually, the step of producing a second electrode comprises deposition of the second electrode through a shadow mask under a high vacuum. Typically, the vacuum is about $10^{-6}$ mBar. The second electrode may, for example, be an electrode of a thickness from 100 to 200 nm. Typically, the second electrode is an electrode of a thickness from 150 nm.

Typically, the distance between the second electrode and the porous dielectric scaffold material is from is from 50 nm to 400 nm, more typically from 150 nm to 250 nm. Often, the distance between the second electrode and the porous dielectric scaffold material is around 200 nm.

Often, the process for producing an the optoelectronic device of the invention is a process for producing a photovoltaic device, for instance a solar cell, wherein the AM1.5G 100 mWcm$^{-2}$ power conversion efficiency of the photovoltaic device is equal to or greater than 7.3%. Typically, the AM1.5G 100 mWcm$^{-2}$ power conversion efficiency is equal to or greater than 10.9%.

Typically, the process for producing an the optoelectronic device of the invention is a process for producing a photovoltaic device, wherein the photocurrent of the photovoltaic device is equal to or greater than 15 mAcm$^{-2}$. More typically, the photocurrent is equal to or greater than 20 mAcm$^{-2}$.

The invention is further described in the Examples which follow.

EXAMPLES

Experimental Description:

1. Synthesis of Organometal Halide Perovskites:

1.1. Preparation of Methylammonium Iodide Precursor

Methylamine ($CH_3NH_2$) solution 33 wt. % in absolute ethanol (Sigma-Aldrich) was reacted with hydriodic acid 57 wt. % in water (Sigma-Aldrich) at 1:1 molar ratio under nitrogen atmosphere in anhydrous ethanol 200 proof (Sigma-Aldrich). Typical quantities were 24 ml methylamine, 10 ml hydroiodic acid and 100 ml ethanol. Crystallisation of methylammonium iodide ($CHNH_3I$) was achieved using a rotary evaporator a white coloured precipitate was formed indicating successful crystallisation.

The methylamine can be substituted for other amines, such as ethylamine, n-butylamine, tert-butylamine, octylamine etc. in order to alter the subsequent perovskite properties. In addition, the hydriodic acid can be substituted with other acids to form different perovskites, such as hydrochloric acid.

1.2. Preparation of Methylammonium Iodide Lead (II) Chloride ($CH_3NH_3PbCl_2I$) Perovskite Solution Methylammonium iodide ($CHNH_3I$) precipitate and lead (II) chloride (Sigma-Aldrich) was dissolved in dimethylformamide ($C_3H_7NO$) (Sigma-Aldrich) at 1:1 molar ratio at 20 vol. %.

For making different perovskites, different precursors, such as different lead(II)halides or indeed different metals halides all together, such as Sn iodide.

1.3. Generalising the Organometal Halide Perovskite Structure

The perovskite structure is defined as $ABX_3$, where A=cation (0,0,0)—ammonium ion, B=cation (½, ½, ½)—divalent metal ion, and X=anion (½, ½, 0)—halogen ion. The table below indicates possible mixed-anion peroskites.

Fixing: [A]=Methylammonium, [B]=Pb, varying [X]=any halogen

| Perovskite | Methylammonium-[X] | Lead halide ($Pb[X]_2$) |
| --- | --- | --- |
| $CH_3NH_3PbBr_3$ | $CH_3NH_3Br$ | $PbBr_2$ |
| $CH_3NH_3PbBrI_2$ | $CH_3NH_3Br$ | $PbI_2$ |
| $CH_3NH_3PbBrCl_2$ | $CH_3NH_3Br$ | $PbCl_2$ |
| $CH_3NH_3PbIBr_2$ | $CH_3NH_3I$ | $PbBr_2$ |
| $CH_3NH_3PbI_3$ | $CH_3NH_3I$ | $PbI_2$ |
| $CH_3NH_3PbICl_2$ | $CH_3NH_3I$ | $PbCl_2$ |
| $CH_3NH_3PbClBr_2$ | $CH_3NH_3Cl$ | $PbBr_2$ |
| $CH_3NH_3PbI_2Cl$ | $CH_3NH_3Cl$ | $PbI_2$ |
| $CH_3NH_3PbCl_3$ | $CH_3NH_3Cl$ | $PbCl_2$ |

Fixing: [A]=Methylammonium, [B]=Sn, varying [X]=any halogen

| Perovskite | Methylammonium-[X] | Tin halide ($Sn[X]_2$) |
| --- | --- | --- |
| $CH_3NH_3SnBr_3$ | $CH_3NH_3Br$ | $SnBr_2$ |
| $CH_3NH_3SnBrI_2$ | $CH_3NH_3Br$ | $SnI_2$ |
| $CH_3NH_3SnBrCl_2$ | $CH_3NH_3Br$ | $SnCl_2$ |
| $CH_3NH_3SnF_2Br$ | $CH_3NH_3Br$ | $SnF_2$ |
| $CH_3NH_3SnIBr_2$ | $CH_3NH_3I$ | $SnBr_2$ |
| $CH_3NH_3SnI_3$ | $CH_3NH_3I$ | $SnI_2$ |
| $CH_3NH_3ISnCl_2$ | $CH_3NH_3I$ | $SnCl_2$ |
| $CH_3NH_3SnF_2I$ | $CH_3NH_3I$ | $SnF_2$ |
| $CH_3NH_3SnClBr_2$ | $CH_3NH_3Cl$ | $SnBr_2$ |
| $CH_3NH_3SnI_2Cl$ | $CH_3NH_3Cl$ | $SnI_2$ |
| $CH_3NH_3SnCl_3$ | $CH_3NH_3Cl$ | $SnCl_2$ |
| $CH_3NH_3SnF_2Cl$ | $CH_3NH_3Cl$ | $SnF_2$ |

[A] may be varied using different organic elements, for example as in Liang et al., U.S. Pat. No. 5,882,548, (1999) and Mitzi et al., U.S. Pat. No. 6,429,318, (2002).

1.4 Blended Perovskites

| Perovksite 1 | Perovskite 2 | Outcome |
| --- | --- | --- |
| $CH_3NH_3PbICl_2$ | $CH_3NH_3PbIBr_2$ | Red |
| $CH_3NH_3PbICl_2$ | $CH_3NH_3PbBrI_2$ | Yellow |
| $CH_3NH_3PbICl_2$ | $CH_3NH_3PbI_3$ | Dark brown |
| $CH_3NH_3PbICl_2$ | $CH_3NH_3PbBr_3$ | Yellow |

| Perovksite 1 | Perovskite 2 | Outcome |
|---|---|---|
| $CH_3NH_3PbBrCl_2$ | $CH_3NH_3PbIBr_2$ | Yellow |
| $CH_3NH_3PbBrCl_2$ | $CH_3NH_3PbBrI_2$ | Yellow |
| $CH_3NH_3PbBrCl_2$ | $CH_3NH_3PbI_3$ | Brown |
| $CH_3NH_3PbBrCl_2$ | $CH_3NH_3PbBr_3$ | Yellow |

1.5 Stability of Mixed-Halide Perovskites Against Single-Halide Perovskites

The inventors have found that photovoltaic devices comprising a mixed-halide perovskite do absorb light and operate as solar cells. When fabricating films from the single halide perovskites in ambient conditions. The perovskites form, but quickly bleach in colour. This bleaching is likely to be due to the adsorption of water on to the perovskite surface, which is known to bleach the materials. When the complete solar cells are constructed in ambient conditions using these single halide perovskites, they perform very poorly with full sun light power conversion efficiencies of under 1%. In contrast, the mixed halide perovskites can be processed in air, and show negligible colour bleaching during the device fabrication process. The complete solar cell incorporating the mixed halide perovskites perform exceptionally well in ambient conditions, with full sun power conversion efficiency of over 10%.

1.6 Preparation of Perovskites Comprising a Formamidinium Cation

Formamidinium iodide (FOI) and formamidinium bromide (FOBr) were synthesised by reacting a 0.5M molar solution of formamidinium acetate in ethanol with a 3× molar excess of hydroiodic acid (for FOI) or hydrobromic acid (for FOBr). The acid was added dropwise whilst stirring at room temperature, then left stirring for another 10 minutes. Upon drying at 100° C., a yellow-white powder is formed, which is then dried overnight in a vacuum oven before use. To form $FOPbI_3$ and $FOPbBr_3$ precursor solutions, FOI and $PbI_2$ or FOBr and $PbBr_2$ were dissolved in anhydrous N,N-dimethylformamide in a 1:1 molar ratio, 0.88 millimoles of each per ml, to give 0.88M perovskite solutions. To form the $FOPbI_{3z}Br_{3(1-z)}$ perovskite precursors, mixtures were made of the $FOPbI_3$ and $FOPbBr_3$ 0.88M solutions in the required ratios, where z ranges from 0 to 1.

Films for characterisation or device fabrication were spin-coated in a nitrogen-filled glovebox, and annealed at 170° C. for 25 minutes in the nitrogen atmosphere.

2. Insulating Mesoporous Paste:

2.1: $Al_2O_3$ Paste:

Aluminum oxide dispersion was purchased from Sigma-Aldrich (10% wt in water) and was washed in the following manner: it was centrifuged at 7500 rpm for 6 h, and redispersed in Absolute Ethanol (Fisher Chemicals) with an ultrasonic probe; which was operated for a total sonication time of 5 minutes, cycling 2 seconds on, 2 seconds off. This process was repeated 3 times.

For every 10 g of the original dispersion (1 g total $Al_2O_3$) the following was added: 3.33 g of α-terpineol and 5 g of a 50:50 mix of ethyl-cellulose 10 cP and 46 cP purchased from Sigma Aldrich in ethanol, 10% by weight. After the addition of each component, the mix was stirred for 2 minutes and sonicated with the ultrasonic probe for 1 minute of sonication, using a 2 seconds on 2 seconds off cycle. Finally, the resulting mixture was introduced in a Rotavapor to remove excess ethanol and achieve the required thickness when doctor blading, spin-coating or screen printing.

2.2 $SiO_2$ Paste:

$SiO_2$ particles were synthesized utilizing the following procedure (see G. H. Bogush, M. A. Tracy, C. F. Zukoski, Journal of Non-Crystalline Solids 1988, 104, 95.):

2.52 ml of deionized water were added into 59.2 ml of absolute ethanol (Fisher Chemicals). This mixture was then stirred violently for the sequential addition of the following reactives: 0.47 ml of Ammonium Hydroxide 28% in water (Sigma Aldrich) and 7.81 ml of Tetraethyl Orthosilicate (TEOS) 98% (Sigma Aldrich). The mixture was then stirred for 18 hours to allow the reaction to complete.

The silica dispersion was then washed following the same washing procedure as outlined previously for the $Al_2O_3$ paste (Example 2.1).

The amount of silica was then calculated assuming that all the TEOS reacts. In our case, 2.1 g of $SiO_2$ was the result of the calculation. For every 1 g of calculated $SiO_2$ the following were added: 5.38 g of anhydrous terpineol (Sigma Aldrich) and 8g of a 50:50 mix of ethyl-cellulose 5-15 mPa·s and 30-70 mPa·s purchased from Sigma Aldrich in ethanol, 10% by weight. After the addition of each component, the mix was stirred for 2 minutes and sonicated with the ultrasonic probe for 1 minute of sonication, using a 2 seconds on 2 seconds off cycle.

3. Cleaning and Etching of the Electrodes:

The perovskite solar cells used and presented in these examples were fabricated as follows: Fluorine doped tin oxide (F:$SnO_2$/FTO) coated glass sheets (TEC 15, 15 Ω/square, Pilkington USA) were etched with zinc powder and HCl (2 M) to give the required electrode pattern. The sheets were subsequently cleaned with soap (2% Hellemanex in water), distilled water, acetone, ethanol and finally treated under oxygen plasma for 5 minutes to remove any organic residues.

4. Deposition of the Compact $TiO_2$ Layer:

The patterned FTO sheets were then coated with a compact layer of $TiO_2$ (100 nm) by aerosol spray pyrolysis deposition of a titanium diisopropoxide bis(acetylacetonate) ethanol solution (1:10 titanium diisopropoxide bis(acetylacetonate) to ethanol volume ratio) at 250° C. using air as the carrier gas (see Kavan, L. and Gratzel, M., Highly efficient semiconducting $TiO_2$ photoelectrodes prepared by aerosol pyrolysis, Electrochim. Acta 40, 643 (1995); Snaith, H. J. and Gratzel, M., The Role of a "Schottky Barrier" at an Electron-Collection Electrode in Solid-State Dye-Sensitized Solar Cells. Adv. Mater. 18, 1910 (2006)).

5. Deposition of the Mesoporous Insulating Metal Oxide Scaffold:

The insulating metal oxide paste (e.g. the $Al_2O_3$ paste) was applied on top of the compact metal oxide layer (typically compact $TiO_2$), via screen printing, doctor blade coating or spin-coating, through a suitable mesh, doctor blade height or spin-speed to create a film with an average thickness of between 100 to 1000 nm, preferably 200 to 500 nm, and most preferably 300 nm. The films were subsequently heated to 450 degrees Celsius and held there for 30 minutes in order to degrade and remove the cellulose, and the cooled ready for subsequent perovskite solution deposition.

6. Deposition of the Perovskite Precursor Solution and Formation of the Mesoporous Perovskite Semiconducting Electrode A small volume, between 20 to 100 μl of the solution of the perovskite precursor solution in DMF (methylammonium iodide lead (II) chloride ($CH_3NH_3PbCl_2I$)) at a volume concentration of between 5 to 40 vol % was dispensed onto each preprepared mesoporous electrode film and left for 20 s before spin-coating at 1500 rpm for 30 s in air. The coated films were then placed on a hot plate set at 100 degrees Celsius and left for 45 minutes at this temperature in air, prior to cooling. During the drying procedure at 100 degrees, the coated electrode changed colour from light yellow to dark brown, indicating the formation of the desired perovskite film with the semiconducting properties.

7. Creation of Mesoporous Perovskite Films.

To the perovskite solution, for every 3 g of calculated perovskite material, 1 g of 50:50 mix of ethyl-cellulose 5-15 mPa·s and 30-70 mPa·s purchased from Sigma Aldrich is added and stirred until completely dissolved. 50 μl of this blend solution of perovskite and ethyl cellulose is then deposited onto the substrates and spin-coated at 1500 rpm for 30 s in air. The substrates used are compact $TiO_2$ coated FTO glass for devices and glass microscope slides for characterisation. After coating, the films are heated on a hot plate at 100 degrees for 45 minutes to dry the films and form the perovskites. Subsequently the films are rinsed in toluene, which selectively washes out the cellulose leaving a mesorporous perovskite film. The films are reheated to 100 degrees for 10 minutes to dry out any residual solvent, and then cooled prior to coating with the hole-transporter.

8. Hole-Transporter Deposition and Device Assembly

The hole transporting material used was spiro-OMeTAD (Lumtec, Taiwan), which was dissolved in chlorobenzene at a typical concentration of 180 mg/ml. After fully dissolving the spiro-OMeTAD at 100° C. for 30 minutes the solution was cooled and tertbutyl pyridine (tBP) was added directly to the solution with a volume to mass ratio of 1:26 μl/mg tBP:spiro-MeOTAD. Lithium bis(trifluoromethylsulfonyl) amine salt (Li-TFSI) ionic dopant was pre-dissolved in acetonitrile at 170 mg/ml, then added to the hole-transporter solution at 1:12 μl/mg of Li-TFSI solution: spiro-MeOTAD. A small quantity (20 to 70 μl) of the spiro-OMeTAD solution was dispensed onto each perovskite coated mesoporous film and left for 20 s before spin-coating at 1500 rpm for 30 s in air. The films were then placed in a thermal evaporator where 200 nm thick silver electrodes were deposited through a shadow mask under high vacuum ($10^{-6}$ mBar).

9. Fabrication of Devices Comprising $FOPbI_{3-z}Br_3$ (1-z)

Devices were fabricated on fluorine-doped tin oxide coated glass substrates. These were cleaned sequentially in hallmanex, acetone, propan-2-ol and oxygen plasma. A compact layer of $TiO_2$ was deposited by spin-coating a mildly acidic solution of titanium isopropoxide in ethanol. This was dried at 150° C. for 10 minutes. The $TiO_2$ mesoporous layer was deposited by spin-coating at 2000 rpm a 1:7 dilution by weight of Dyesol 18NR-T paste in ethanol, forming a layer of ~150 nm. The layers were then sintered in air at 500° C. for 30 minutes. Upon cooling, perovskite precursors were spin-coated at 2000 rpm in a nitrogen-filled glovebox, followed by annealing at 170° C. for 25minutes in the nitrogen atmosphere. The hole-transport layer was deposited by spin-coating an 8 wt. % 2,2',7,7'-tetrakis-(N, N-di-pmethoxyphenylamine)9,9'-spirobifluorene (spiro-OMeTAD) in chlorobenzene solution with added tert-butylpyridine (tBP) and lithium bis(trifluoromethanesulfonyl) imide (Li-TFSI). Devices were completed by evaporation of 60 nm Au contacts.

Experimental Results

Figure 4:
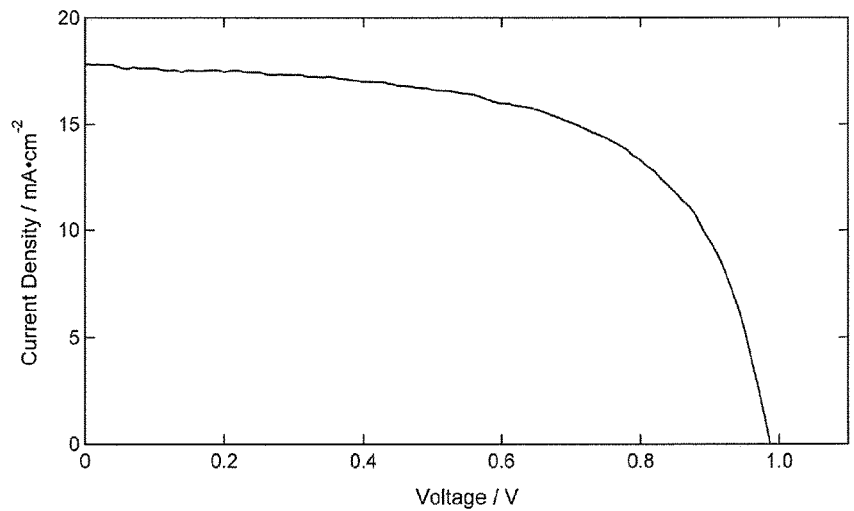
FIG. 4 shows the current-voltage characteristics under simulated AM1.5G illumination of a device assembled in mesoporous absorber structure with hole-conductor: F:SnO$_2$/Compact TiO$_2$/Mesoporous Al$_2$O$_3$/K330/Spiro OMeTAD/Ag. On the graph the voltage in volts is plotted on the x-axis and the current density in mAcm$^{-2}$ is plotted on the y-axis.

The motivation of the present inventors has been to realize a solution processable solar cell which overcomes the inherent issues with organic absorbers and disordered metal oxides. They have followed a similar approach to ETA solar cells, thus capitalizing on the inorganic absorber, but entirely eliminated the mesoporous n-type metal oxide. They have employed mesoporous alumina as an "insulating scaffold" upon which an organometal halide perovskite is coated as the absorber and n-type component. This is contacted with the molecular hole-conductor, (2,2(7,7(-tetrakis-(N,N-di-pmethoxyphenylamine)9,9(-spirobifluorene) (spiro-OMeTAD) (U. Bach et al., Nature 395, 583-585 (1998)) which completes the photoactive layer. The photoactive layer is sandwiched between a semi-transparent fluorine doped tin oxide (FTO) and metal electrode to complete the device. A schematic illustration of a cross section of a device is shown in FIG. 1. Upon photoexcitation, light is absorbed in the perovskite layer, generating charge carriers. Holes are transferred to the hole-transporter and carried out of the solar cell, while the electrons percolate through the perovskite film and are collected at the FTO electrode. The displacement of the holes to the hole-transporter, removes the "minority" carrier from the absorber and is key to enabling efficient operation. Record power conversion efficiencies of 10.9% are demonstrated under simulated AM1.5 full sun light, representing the most efficient solid-state hybrid solar cell reported to date. A current voltage curve for such a solar cell is shown in FIG. 4.

Absorber and Thin Film Characterisation

The perovskite structure provides a framework to embody organic and inorganic components into a neat molecular composite, herein lie possibilities to manipulate material properties governed by the atomic orbitals of the constituent elements. By experimenting with the interplay between organic-inorganic elements at the molecular scale and controlling the size-tunable crystal framework cell it is possible to create new and interesting materials using rudimentary wet chemical methods. Indeed, seminal work by Era and Mitzi champion the layered perovskite based on organometal halides as worthy rivals to more established materials, demonstrating excellent performance as light-emitting diodes (H. D. Megaw, Nature 155, 484-485 (1945), M. Era, T. Tsutsui, S. Saito, Appl. Phys. Lett. 67, 2436-2438 (1995)) and transistors with mobilities competitive comparable with amorphous silicon (C. R. Kagan, D. B. Mitzi, C. D. Dimitrakopoulos, Science 286, 945-947 (1999)).

Figure 2:
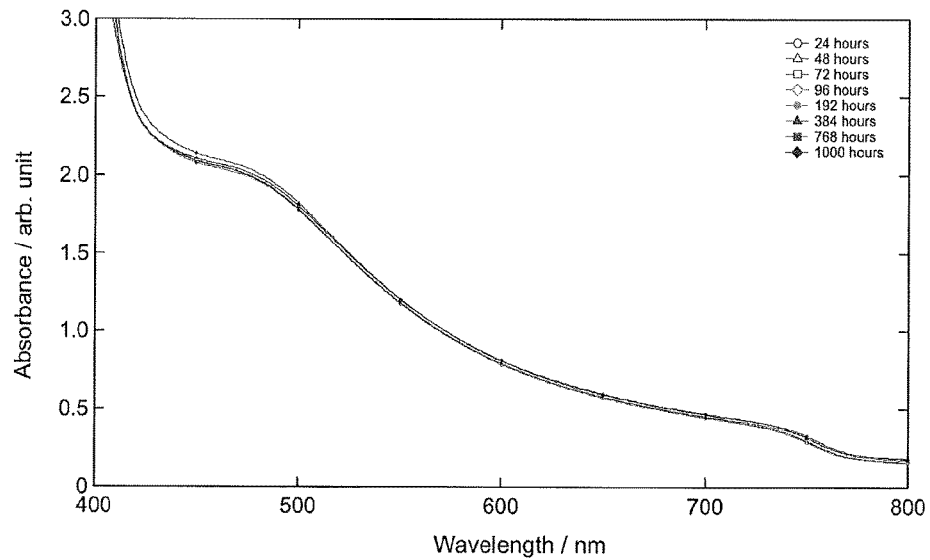
FIG. 2 shows the UV-Vis absorbance spectra for a device assembled in absorber-sensitised structure with hole-conductor: F:SnO$_2$/Compact TiO$_2$/mesoporous oxide/CH$_3$NH$_3$PbCl$_2$I/Spiro OMeTAD sealed using surlyn and epoxy with light soaking under simulated AM1.5G illumination over time shown in the legend in hours. On the graph wavelength in nm is plotted on the x-axis and the absorbance in arbitrary units is plotted on the y-axis.

The specific perovskite the inventors introduce here is of mixed-halide form: methylammonium iodide lead (II) chloride, ($CH_3NH_3PbCl_2I$) which is processed from a precursor solution in N,N-Dimethylformamide as the solvent via spin-coating in ambient conditions. Unlike the single-halide lead perovskite absorbers previously reported in solar cells (A. Kojima, K. Teshima, Y. Shirai, T. Miyasaka, J. Am. Chem. Soc. 131, 6050-6051 (2009), J-H Im, C-R Lee, J-W Lee, S-W Park, N-G Park, Nanoscale 3, 4088-4093 (2011)), this iodide-chloride mixed-halide perovskite is remarkably stable and easily processible in air. In FIG. 2 the UV-Vis-NIR absorption spectra of the mixed halide perovskite in the solar cell composite demonstrates good light harvesting capabilities over the visible to near infrared spectrum. Also shown is the light absorption of the active layer of a complete solar cell sealed in a nitrogen atmosphere, during 1000 hours of constinuous illumination under full sunlight. This illustrates good basic stability of the perovskite absorber.

Solar Cell Fabrication

Figure 1B:
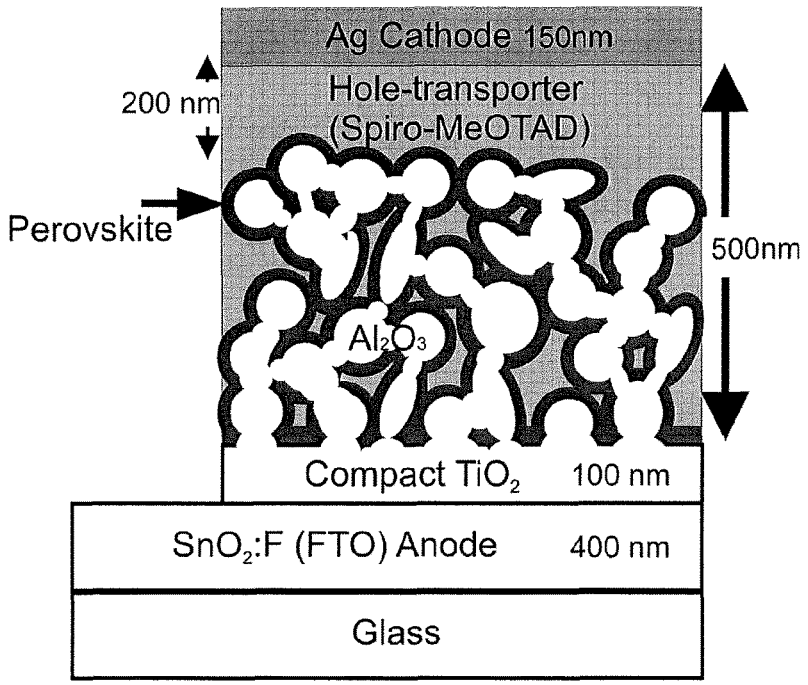
FIG. 1b is a schematic diagram of the optoelectronic device of the invention in which the porous material comprises a porous dielectric scaffold material (alumina) and a coating disposed on the surface thereof, which coating comprises a perovskite semiconductor. In the embodiment shown, the porosity arises from the alumina scaffold, not from the perovskite semiconductor. The porous material is infiltrated by a molecular organic hole transporter, Spiro-MeOTAD.

To construct the solar cells fluorine doped tin oxide (FTO) is coated with a compact layer of $TiO_2$ via spray-pyrolysis (L. Kavan, M. Grätzel, Electrochim. Acta 40, 643-652 (1995)), which assures selective collection of electrons at the anode. The film is then coated with a paste of alumina, $Al_2O_3$, nanoparticles and cellulose via screen printing, which is subsequently sintered at 500° C. to decompose and remove the cellulose, leaving a film of mesoporous $Al_2O_3$ with a porosity of approximately 70%. The perovskite precursor solution is coated within the porous alumina film via spin-coating. To elaborate upon this coating process, there has been extensive previous work investigating how solution-cast materials infiltrate into mesoporous oxides (H. J. Snaith et al., Nanotechnology 19, 424003-424015 (2008), T. Leijtens et al., ACS Nano 6, 1455-1462 (2012), J. Melas-Kyriazi et al., Adv. Energy. Mater. 1, 407-414 (2011), I-K. Ding et al., Adv. Funct. Mater. 19, 2431-2436 (2009), A. Abrusci et al., Energy Environ. Sci. 4, 3051-3058 (2011)). If the concentration of the solution is low enough, and the solubility of the cast material high enough, the material will completely penetrate the pores as the solvent evaporates. The usual result is that the material forms a "wetting" layer upon the internal surface of the mesoporous film, and uniformly, but not completely, fills the pores throughout the thickness of the electrode. (H. J. Snaith et al., Nanotechnology 19, 424003-424015 (2008), T. Leijtens et al., ACS Nano 6, 1455-1462 (2012), J. Melas-Kyriazi et al., Adv. Energy. Mater. 1, 407-414 (2011), I-K. Ding et al., Adv. Funct. Mater. 19, 2431-2436 (2009), A. Abrusci et al., Energy Environ. Sci. 4, 3051-3058 (2011)) The degree of "pore-filling" is controlled by varying the solution concentration (J. Melas-Kyriazi et al., Adv. Energy. Mater. 1, 407-414 (2011), I-K. Ding et al., Adv. Funct. Mater. 19, 2431-2436 (2009), A. Abrusci et al., Energy Environ. Sci. 4, 3051-3058 (2011)). If the concentration of the casting solution is high, a "capping layer" will be formed on top of the mesoporous oxide in addition to a high degree of pore-filling. In the films created here, there is no appearance of a capping layer of perovskite when the mesoporous $Al_2O_3$ films are coated with the perovskite, indicating that the perovskite is predominantly located within the porous film, realising a porous perovskite film. To complete the photoactive layer, the hole-transporter, spiro-OMeTAD, is spin-coated on top of the perovskite coated electrode. The spiro-OMeTAD does predominantly fill the pores and forms a capping layer on top of the whole film. The film is capped with a silver electrode to complete the device. A schematic illustration of the device structure is shown in FIG. 1b. We term this type of solar cell, where the photoactive layer is assembled upon a porous insulating scaffold as a meso-superstructured solar cell (MSSCs).

Solar Cell Characterization

Figure 3:
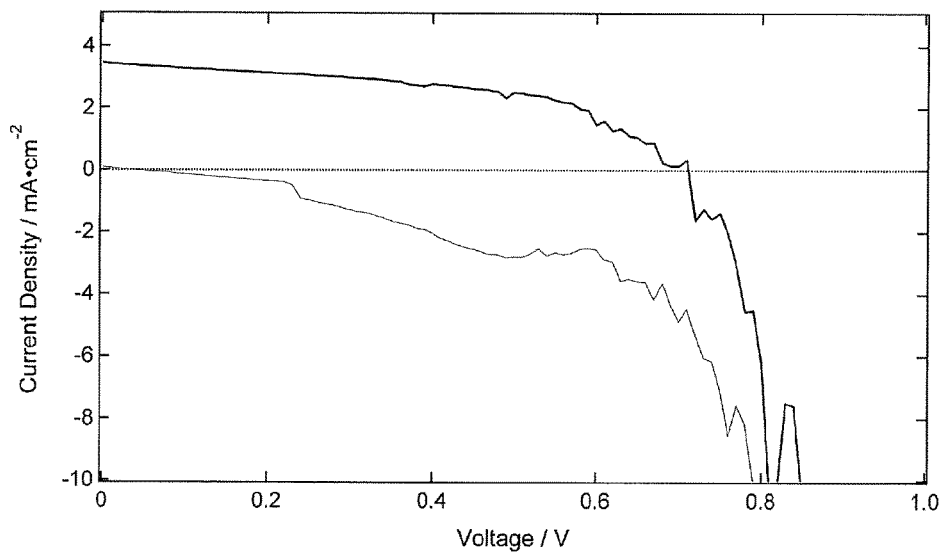
FIG. 3 shows the current-voltage characteristics under simulated AM1.5G illumination of 100 mWcm$^{-2}$ (top curve) and in the dark (bottom curve) of a device assembled in bilayer structure: F:SnO$_2$/Compact TiO$_2$/K330/Spiro OMeTAD/Ag. On the graph the voltage in volts is plotted on the x-axis and the current density in mAcm$^{-2}$ is plotted on the y-axis.
Figure 5:
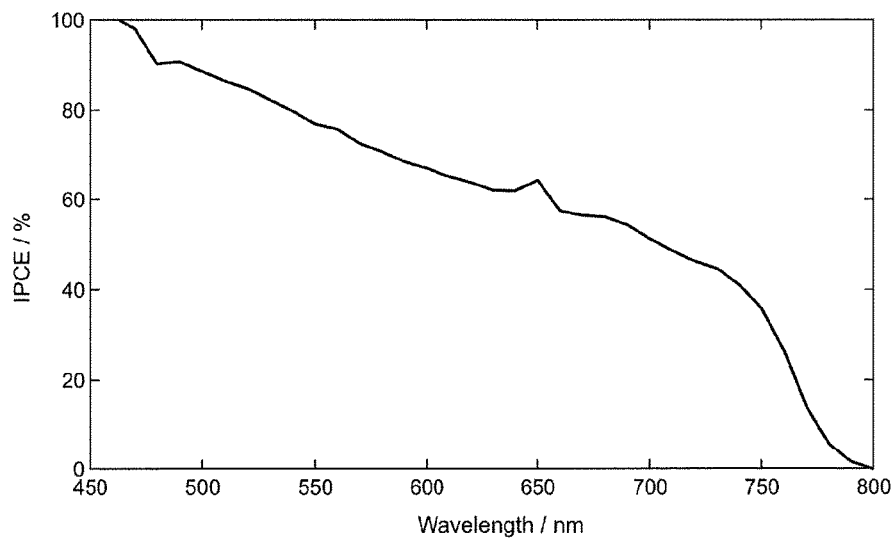
FIG. 5 shows the Incident Photon-to-Electron Conversion Efficiency (IPCE) action spectra of a device assembled in mesoporous absorber structure with device structure: F:SnO$_2$/Compact TiO$_2$/Mesoporous Al$_2$O$_3$/K330/Spiro OMeTAD/Ag. On the graph the wavelength in nm is plotted on the x-axis and the IPCE in plotted on the y-axis.

In order to assess the basic efficiency of the absorber material, we have first constructed a flat junction bilayer solar cell composed of films of perovskite and spiro-OMeTAD sandwiched between the compact $TiO_2$ and Ag electrodes. For a printable thin film solar cell, this operates reasonably well generating over 4 mAcm$^{-2}$ short-circuit photocurrent, and exhibiting a power conversion efficiency approaching 2%, as shown in FIG. 3. This indicates that free charges are generated relatively easily within the perovskite absorber layer. To ensure efficient charge collection in a thin film solar cell configuration, the electron- and hole-diffusion length must be matched and be greater than the absorber layer thickness, without very carefully controlled doping levels and high charge carrier mobilities this is extremely challenging. In FIG. 4 the current-voltage curve for a solar cell composed of FTO-compact $TiO_2$-mesoporous $Al_2O_3$—$CH_3NH_3PbCl_2I$ perovskite-spiro-OMeTAD-Ag measured under simulated full sun illumination is shown. The short-circuit photocurrent is 17 mA cm$^{-2}$ and the open-circuit voltage is close to 1 V giving an overall power conversion efficiency of 10.9%.For the most efficient devices the open-circuit voltage is between 1 to 1.1 V. In FIG. 5, the photovoltaic action spectrum is shown for the solar cell, which gives a peak incident photon-to-electron conversion efficiency above 80% and spans the photoactive region from 450 to 800 nm.

Comparison to Existing Technology

Figure 6:
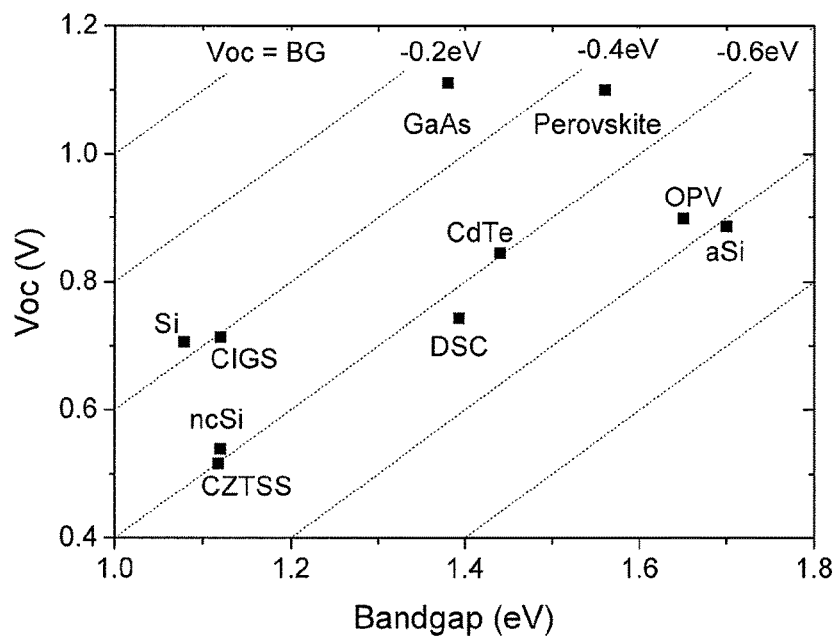
FIG. 6 is a graph of optical band gap on the x-axis against the open-circuit voltage on the y-axis for the "best-in-class" solar cells for most current solar technologies. All the data for the GaAs, Si, CIGS, CdTe, nanocrystaline Si (ncSi), amorphous Si (aSi), CZTSS organic photovoltaics (OPV) and dye-sensitized solar cells (DSC) was taken from Green, M. A., K. Emery, et al. (2012). "Solar cell efficiency tables version 39)." Progress in Photovoltaics 20(1): 12-20. The optical band gap has been estimated by taking the onset of the incident photon-to-electron conversion efficiency, as described in [Barkhouse D A R, Gunawan O, Gokmen T, Todorov T K, Mitzi D B. Device characteristics of a 10.1% hydrazineprocessed Cu2ZnSn(Se,S)4 solar cell. Progress in Photovoltaics: Research and Applications 2012; published online DOI: 10.1002/pip.1160.]

The power-conversion efficiency for this system is at the very highest level for new and emerging solar technologies (M. A. Green, K. Emery, Y. Hishikawa, W. Warta, E. D. Dunlop, Prog. Photovolt. Res. Appl. 19, 565-572 (2011)), but more exciting than the efficiency is the extremely high open-circuit voltage generated. GaAs is the only other photovoltaic technology which both absorbs over the visible to nearIR region and generates such a high open-circuit voltage. The "fundamental energy loss" in a solar cell can be quantified as the difference in energy between the open-circuit voltage generated under full sun light and the band-gap of the absorber (H. J. Snaith, Adv. Funct. Mater. 20, 13-19 (2010)). The theoretical maximum open-circuit voltage can be estimated as a function of band gap following the Shockley-Queisser treatment, and for a material with a band gap of 1.55 eV the maximum possible open-circuit voltage under full sun illumination is 1.3 V, giving a minimum "loss-in-potential" 0.25 eV. In FIG. 6, the open-circuit voltage is plotted versus the optical-band gap of the absorber, for the "best-in-class" of most established and emerging solar technologies. For the meso-superstructured perovskite solar cell the optical band gap is taken to be 1.55 eV and the open-circuit voltage to be 1.1 V. With loss-in-potential as the only metric, the new technology is very well positioned in fourth out of all solar technologies behind GaAs, crystalline silicon and copper indium gallium (di) selenide. Remarkably, the perovskite solar cells have fundamental losses than are lower than CdTe, which is the technology of choice for the world's largest solar company (A. Abrusci et al., Energy Environ. Sci. 4, 3051-3058 (2011)).

Perovskite Crystal Structure

Figure 7:
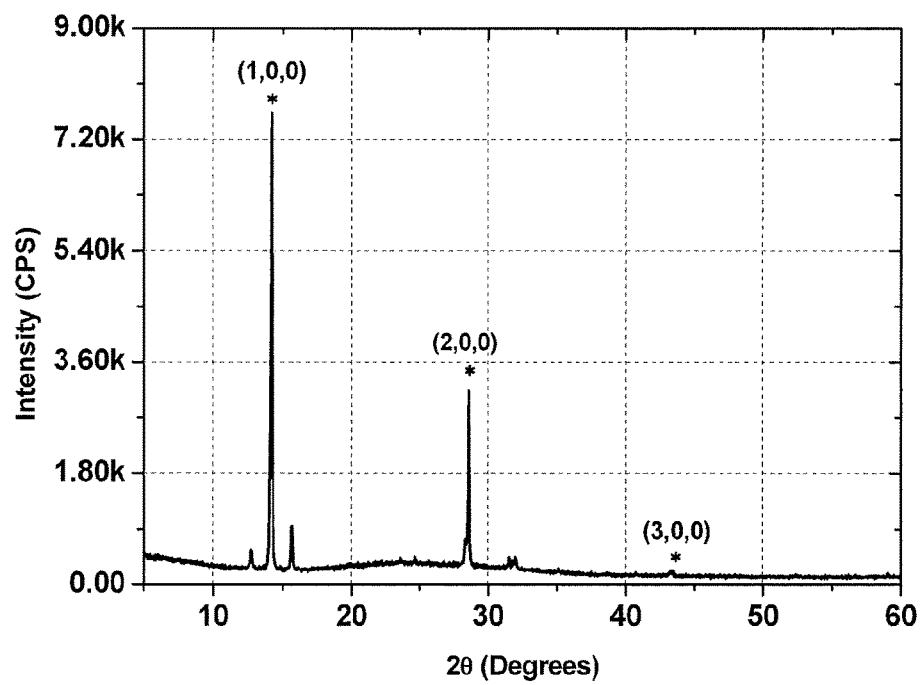
FIG. 7 shows the X-Ray Diffraction (XRD) spectra of K330 at 35 vol % on glass. Degrees in 2-theta are plotted on the x-axis and the number of counts in arbitrary units is plotted on the y-axis.
Figure 8:
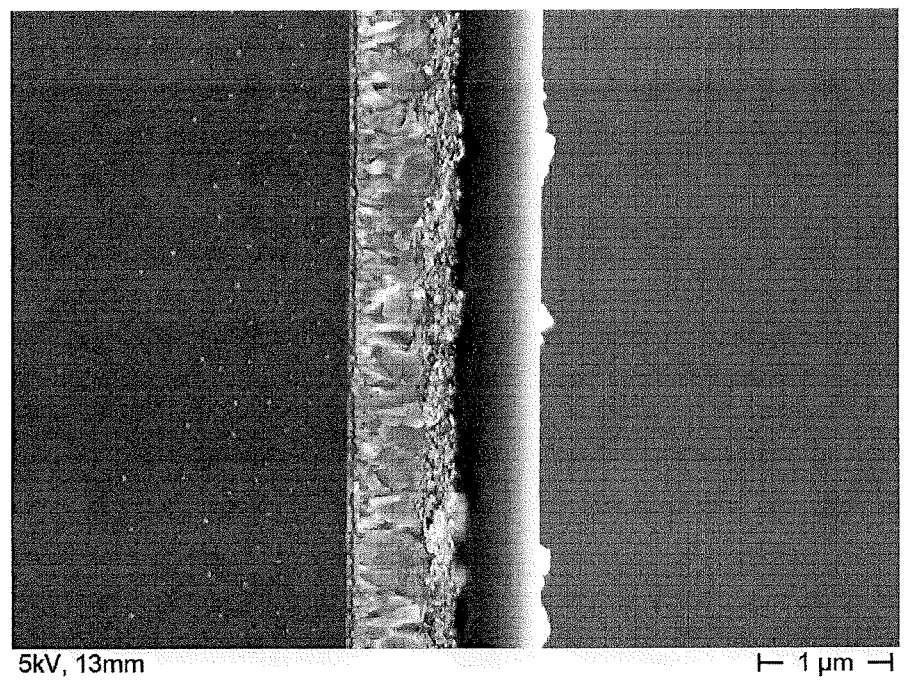
FIG. 8 shows a cross sectional SEM image of a complete photoactive layer; Glass-FTO-mesoporous Al2O3-K330-spiro-OMeTAD.
Figure 9A:
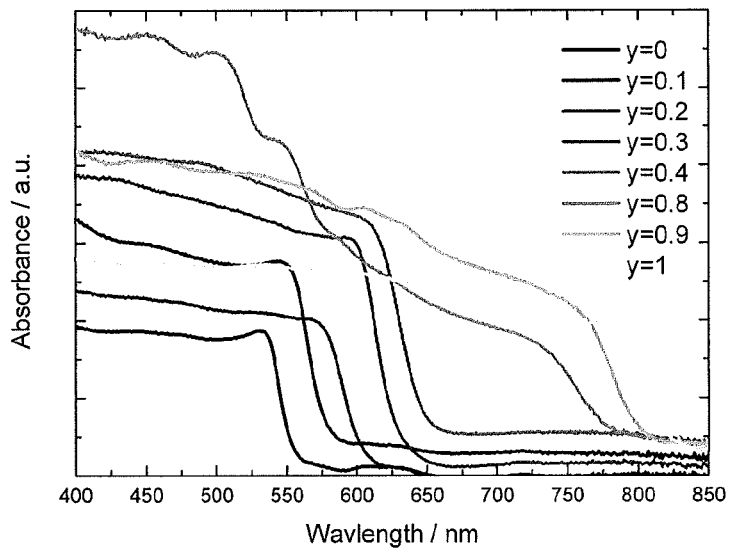
FIG. 9(a) shows UV-vis absorption spectra of the range of FOPbI$_{3y}$Br$_{3(1-y)}$ perovskites and FIG. 9(b) shows steady-state photoluminescence spectra of the same samples.
Figure 9B:
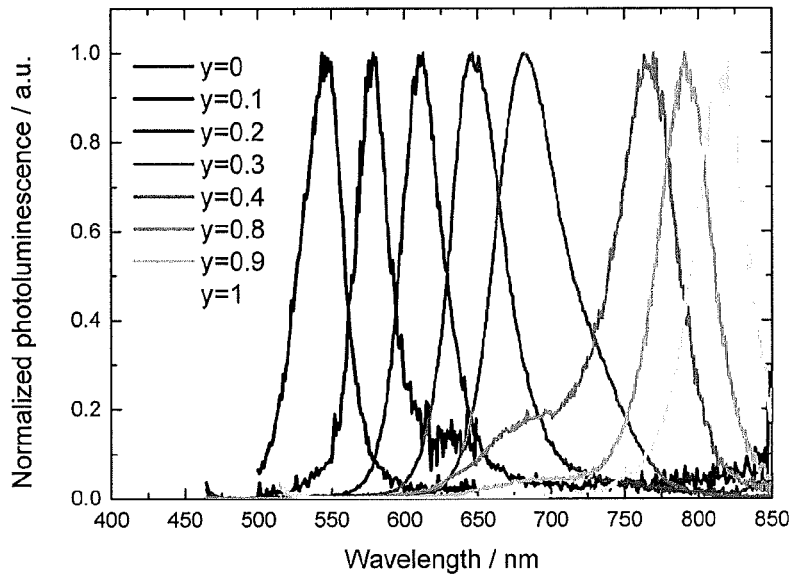
Figure 10D:
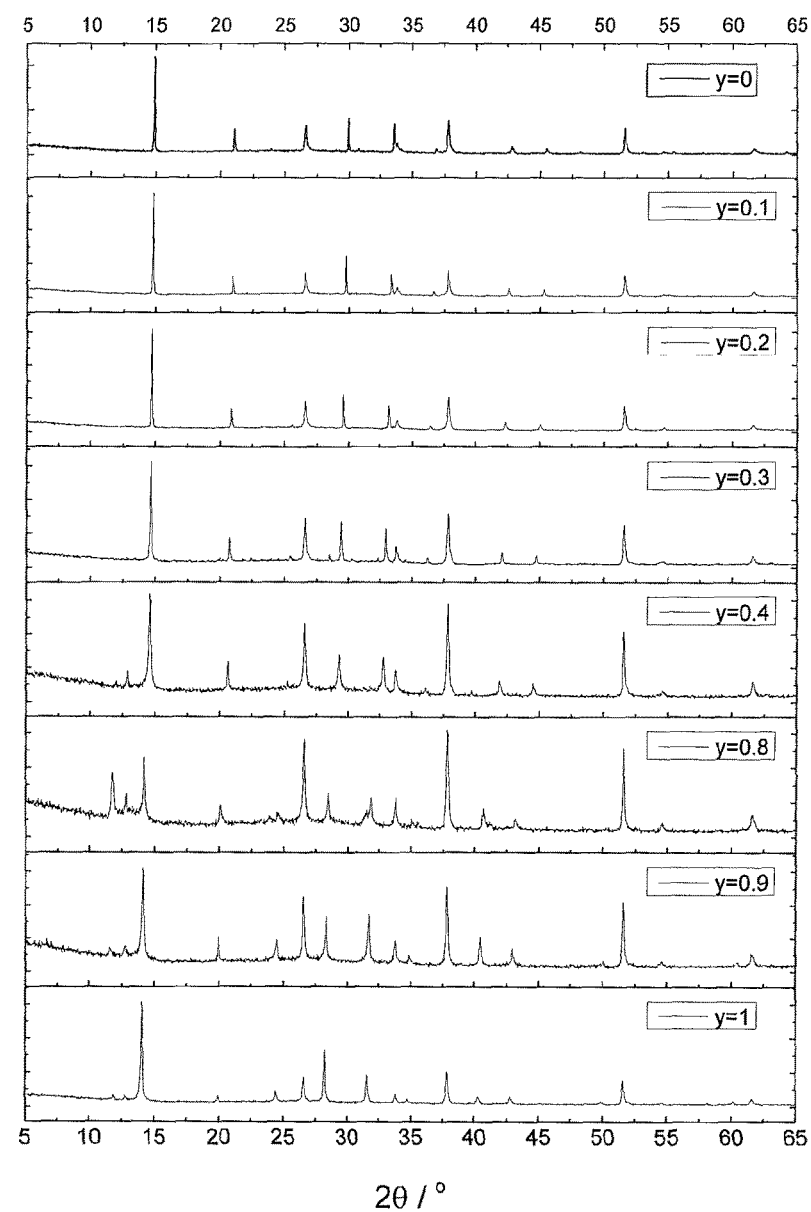
FIG. 10(d) shows X-ray diffraction data for the FOPbI$_{3y}$Br$_{3(1-y)}$ perovskites for various values of y ranging from 0 to 1.
Figure 10E:
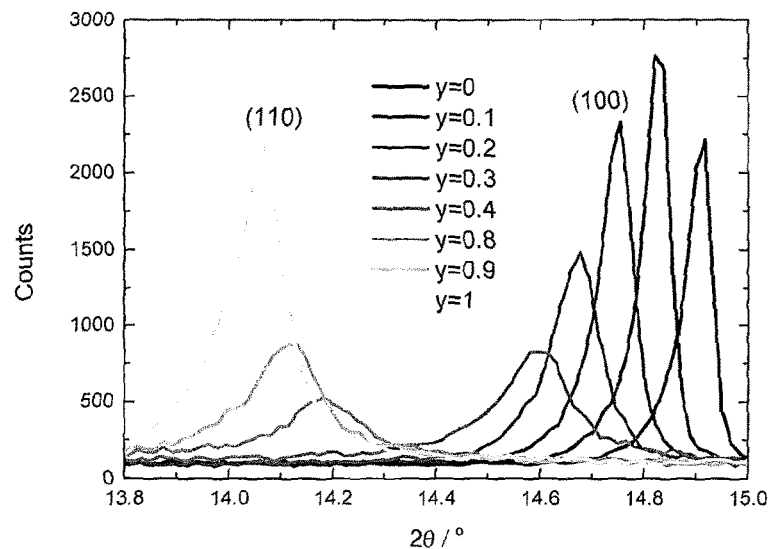
FIG. 10(e) shows a magnification of the transition between the (100) cubic peak and the (110) tetragonal peak, corresponding to the (100) pseudocubic peak, as the system moves from bromide to iodide.
Figure 10F:
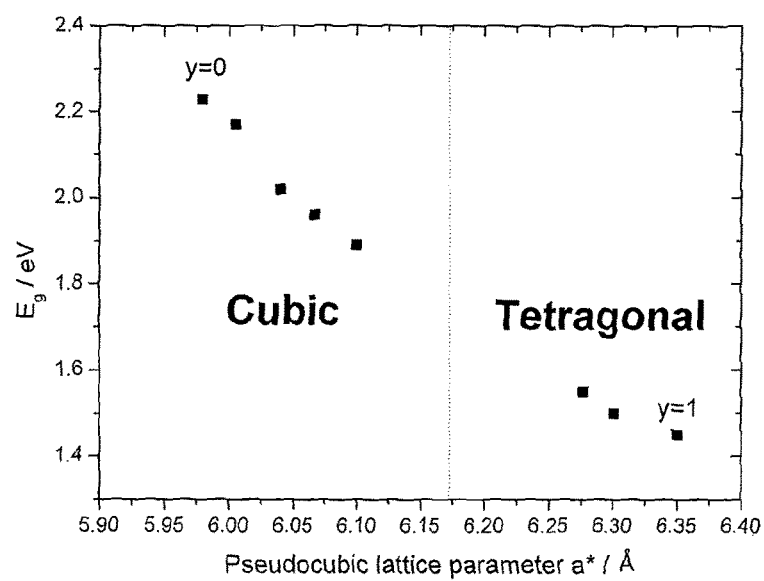
FIG. 10(f) shows a plot of bandgap against calculated pseudocubic lattice parameter.
Figure 11A:
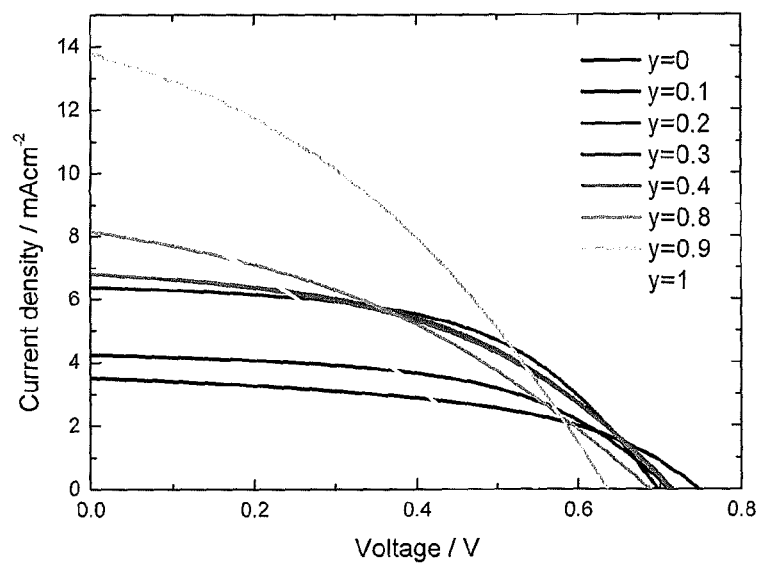
FIG. 11(a) shows average current-voltage characteristics for a batch of solar cells comprising FOPbI$_{3y}$Br$_{3(1-y)}$ perovskites sensitizing mesoporous titania, with spiro-OMeTAD as the hole transporter, measured under simulated AM1.5 sunlight.
Figure 11B:
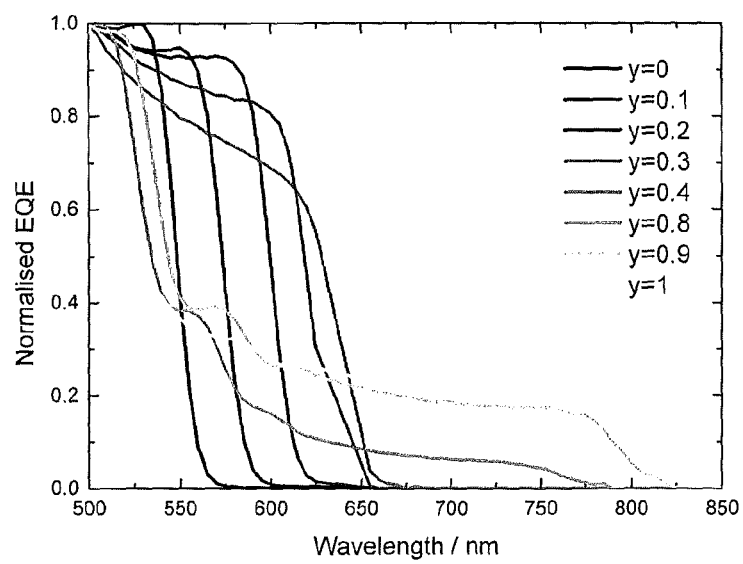
FIG. 11(b) shows a normalised external quantum efficiency for representative cells.
Figure 11C:
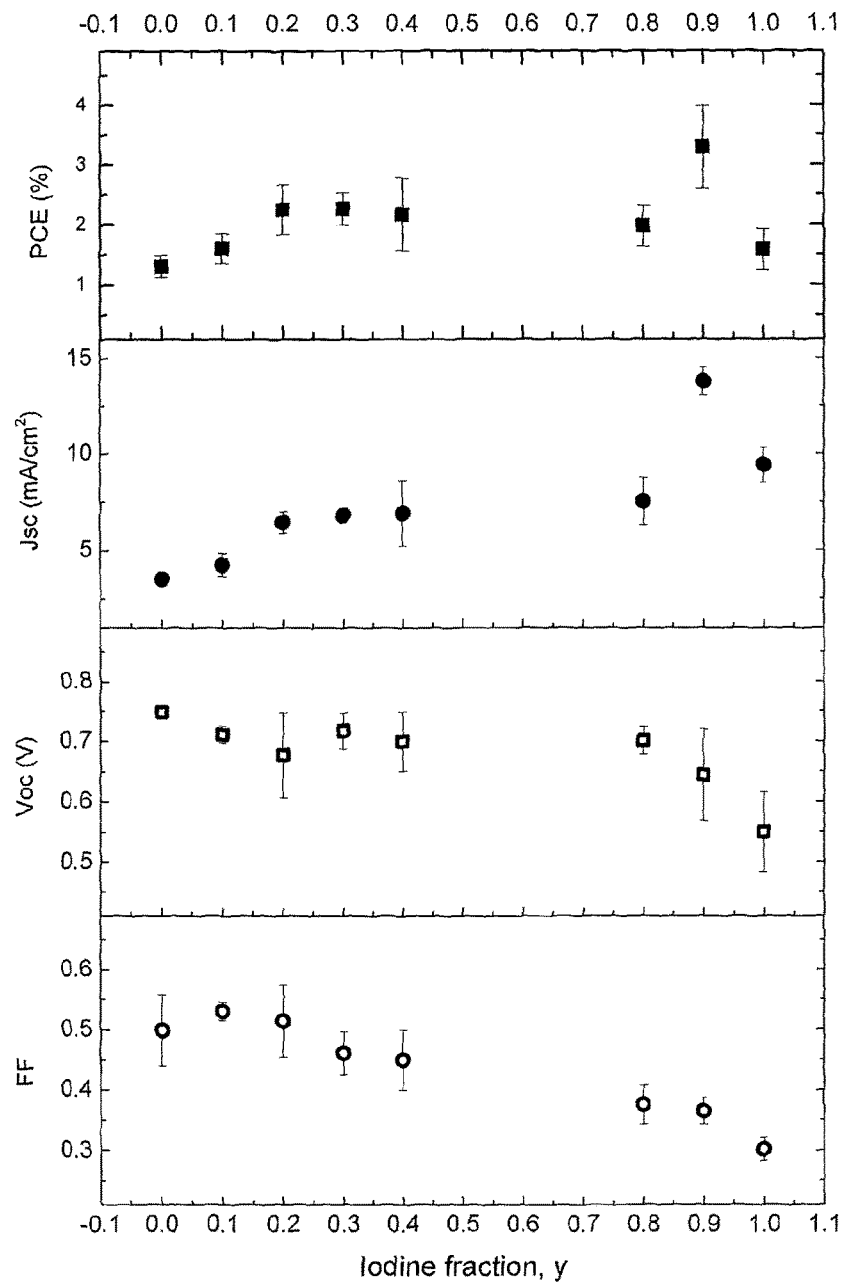
FIG. 11(c) shows a plot of the device parameters of merit for the batch, as a function of the iodine fraction, y, in the FOPbI$_{3y}$Br$_{3(1-y)}$ perovskite.

The X-ray diffraction pattern, shown in FIG. 7 was extracted at room temperature from $CH_3NH_3PbCl_2I$ thin film coated onto glass slide by using X'pert Pro X-ray Diffractometer.

FIG. 7 shows the typical X-ray diffraction pattern of the (Methylammonium Dichloromonoiodo plumbate(II); $CH_3NH_3PbCl_2I$ film on glass substrate. X-ray diffraction pattern confirms the $ABX_3$ type of cubic (a=b=c=90) perovskite structure (Pm3m). $CH_3NH_3PbCl_2I$ gave diffraction peaks at 14.20, 28.58, and 43.27°, assigned as the (100), (200), and (300) planes, respectively of a cubic perovskite structure with lattice parameter a) 8.835 Å, b) 8.835 and c) 11.24 Å. A sharp diffraction peaks at (h 0 0; where h=1-3) suggest that the films fabricated on glass substrate were predominantly single phase and were highly oriented with the a-axis self-assembly ["Organometal Halide Perovskites as Visible-Light Sensitizers for Photovoltaic Cells" Akihiro Kojima, Kenjiro Teshima, Yasuo Shirai and Tsutomu Miyasaka, J. Am. Chem. Soc. 2009, 131, 6050].

The $CH_3NH_3^+$ cation cannot be assigned in the X ray given its dynamic orientation, $CH_3NH_3^+$ is incompatible with the molecular symmetry, and hence the cation is still disordered in this phase at room temperature. And thus, the effective contribution of the C and N atoms to the total diffracted intensity is very small relative to the contributions from Pb and X (Cl and I) ["Alkylammonium lead halides. Part 2. $CH_3NH_3PbX_3$ (X=Cl, Br, I) perovskites: cuboctahedral halide cages with isotropic cation reorientation", Osvaldkn O P and Rodericke Wasylishenm et al. Can. J. Chem. 1990, 68, 412.].

The peak positions for the synthesised mixed $CH_3NH_3PbCl_2I$ at (h,0,0) were observed to be shifted towards lower 2Θ and were positioned in between the pure methylammonium trihalogen plumbate i.e. $CH_3NH_3PbI_3$ and $CH_3NH_3PbCl_3$ ["Dynamic disorder in methylammoniumtrihalogenoplumbates (II) observed by millimeter-wave spectroscopy", A. Poglitsch and D. Weber, J. Chem. Phys. 1987, 87, 6373.] respectively, and also the increased lattice parameter (a=8.835 Å) of the $CH_3NH_3PbCl_2I$ film as compared to pure "Cl" based perovskite i.e. $CH_3NH_3PbCl_3$ (a=5.67 Å) with the addition of "I" content gives an evidence of the formation of mixed halide perovskite ["Optical properties of CH3NH3PbX3 (X=halogen) and their mixed-halide crystals", N. Kitazawa, Y. Watanabe and Y Nakamura, J. Mat Sci. 2002, 37, 3585].

The diffraction pattern of the product contained a few unidentified peaks, they can attributed to the various factors including the presence of some impurity (e.g. Pb(OH)Cl, $CH_3NH_3X$; X=Cl and/or I, or a related compounds that may generate during the synthesis even if slightly excess of reactants are used, and also to the hygroscopic nature of the compound which can resultantly form unwanted impurity ["Alkylammonium lead halides. Part 2. $CH_3NH_3PbX_3$ (X=Cl, Br, I) perovskites: cuboctahedral halide cages with isotropic cation reorientation", Osvaldkn O P and Rodericke Wasylishenm et al. Can. J. Chem. 1990, 68, 412.] Additionally, "I" ion present in the lattice may split some of the peaks at room temperature given the fact that the pure "I" based perovskite ($CH_3NH_3PbI_3$) forms tetragonal structure ["Alkylammonium lead halides. Part 1. Isolated~b 1 6 i~on-s in (CH3NH3)4Pb16-2H2O" Beverlyr Vincent K, Robertsont, Stanlecya merona, N Dosvaldk, Can. J. Chem. 1987, 65, 1042; "Organometal Halide Perovskites as Visible-Light Sensitizers for Photovoltaic Cells" Akihiro Kojima, Kenjiro Teshima, Yasuo Shirai and Tsutomu Miyasaka, J. Am. Chem. Soc. 2009, 131, 6050].

FIGS. 8 to 11 relate to perovskites comprising a formamidinium cation and devices comprising $FOPbI_{3y}Br_{3(1-y)}$. In general, it is considered to be advantageous to retain a 3D crystal structure in the perovskite, as opposed to creating layered perovskites which will inevitably have larger exciton binding energies (Journal of Luminescence 60&61 (1994) 269 274). It is also advantageous to be able to tune the band gap of the perovskite. The band gap can be changed by either changing the metal cations or halides, which directly influence both the electronic orbitals and the crystal structure. Alternatively, by changing the organic cation (for example from a methylammonium cation to a formamidinium cation), the crystal structure can be altered. However, in order to fit within the perovskite crystal, the following geometric condition must be met:

$$(R_A+R_X)=t\sqrt{2}(R_B+R_X)$$

wherein $R_{A,B,\&X}$ are the ionic radii of ABX ions. The inventor have unexpectedly found that formamidinium cation (FO) does indeed form the perovskite structure in a the cubic structure in a $FOPbBr_3$ or $FOPbI_3$ perovskite, and mixed halide perovskites thereof.

The work leading to this invention has received funding from the European Research Council under the European Union's Seventh Framework Programme (FP7/2007-2013/ERC grant agreement n° 279881).

The invention claimed is:

1. A photovoltaic device comprising:
a first electrode;
a second electrode; and, disposed between the first and second electrodes:
   (a) a photoactive layer, wherein the photoactive layer comprises a porous material and a charge transporting material disposed within pores of said porous material, which charge transporting material is a solid state hole transporting material, wherein the porous material consists of a porous semiconductor which is a porous perovskite wherein the perovskite comprises at least one halide anion; and
   (b) a compact layer comprising a metal oxide or a metal chalcogenide.

2. A photovoltaic device according to claim 1 wherein the perovskite is a photosensitizing material.

3. A photovoltaic device according to claim 1 wherein the perovskite has a band gap of equal to or less than 2.8 eV.

4. A photovoltaic device according to claim 1 wherein the perovskite is an intrinsic semiconductor, an n-type semiconductor, or a p-type semiconductor.

5. A photovoltaic device according to claim 1 wherein the hole transporting material comprises any of an organic hole transporting material, and a polymeric or molecular hole transporter.

6. A photovoltaic device according to claim 1 wherein the hole transporting material is selected from spiro-OMeTAD, P3HT, PCPDTBT and PVK.

7. A photovoltaic device according to claim 1 wherein the hole transporting material is an inorganic hole transporter, and the inorganic hole transporter is CuI, CuBr, CuSCN, $Cu_2O$, CuO or CIS.

8. A photovoltaic device according to claim 1, wherein the charge transporting material is an organic electron transporting material.

9. A photovoltaic device according to claim 1 wherein the perovskite comprises a first cation, a second cation, and said at least one halide anion.

10. A photovoltaic device according to claim 9 wherein the second cation is a metal cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$.

11. A photovoltaic device according to claim 10 wherein the metal cation is selected from $Sn^{2+}$, $Pb^{2+}$ and $Cu^{2+}$.

12. A photovoltaic device according to claim 9 wherein the first cation is an organic cation.

13. A photovoltaic device according to claim 12 wherein the organic cation has the formula $(R_1R_2R_3R_4N)^+$, wherein:
$R_1$ is hydrogen, unsubstituted or substituted $C_1$-$C_{20}$ alkyl, or unsubstituted or substituted aryl;
$R_2$ is hydrogen, unsubstituted or substituted $C_1$-$C_{20}$ alkyl, or unsubstituted or substituted aryl;
$R_3$ is hydrogen, unsubstituted or substituted $C_1$-$C_{20}$ alkyl, or unsubstituted or substituted aryl; and
$R_4$ is hydrogen, unsubstituted or substituted $C_1$-$C_{20}$ alkyl, or unsubstituted or substituted aryl.

14. A photovoltaic device according to claim 12 wherein the organic cation has the formula $(R_5NH_3)^+$, wherein $R_5$ is hydrogen, or unsubstituted or substituted $C_1$-$C_{20}$ alkyl.

15. A photovoltaic device according to claim 1 wherein the perovskite is a mixed-anion perovskite comprising two or more different anions selected from halide anions and chalcogenide anions, with the proviso that at least one of the anions is a halide anion.

16. A photovoltaic device according to claim 15 wherein the perovskite is a mixed-halide perovskite, wherein said two or more different anions are two or more different halide anions.

17. A photovoltaic device according to claim 1 wherein the perovskite is a perovskite compound of formula (I):

$$[A][B][X]_3 \qquad (I)$$

wherein:
[A] is at least one organic cation;
[B] is at least one metal cation; and
[X] is said at least one anion; with the proviso that the perovskite compound comprises at least one halide anion.

18. A photovoltaic device according to claim 17 wherein [X] is two or more different anions selected from halide anions and chalcogenide anions, with the proviso that the perovskite compound comprises at least one halide anion.

19. A photovoltaic device according to claim 17 wherein [X] is two or more different halide anions.

20. A photovoltaic device according to claim 1 wherein the perovskite is a perovskite compound of formula (IA):

$$AB[X]_3 \qquad (IA)$$

wherein:
A is an organic cation;
B is a metal cation; and
[X] is two or more different halide anions.

21. A photovoltaic device according to claim 1 wherein the perovskite is a perovskite compound of formula (II):

$$ABX_{3-y}X'_y \qquad (II)$$

wherein:
A is an organic cation;
B is a metal cation;
X is a first halide anion;
X' is a second halide anion which is different from the first halide anion; and
y is from 0.05 to 2.95.

22. A photovoltaic device according to claim 1, wherein the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

23. A photovoltaic device according to claim 1, wherein said perovskite is a first perovskite, and wherein the charge transporting material comprises a second perovskite, wherein the first and second perovskites are the same or different.

24. A photovoltaic device according to claim 23 wherein said first perovskite comprises a first cation, a second cation, and said at least one halide anion.

25. A photovoltaic device according to claim 23 wherein the second perovskite is a perovskite comprising a first cation, a second cation, and at least one anion.

26. A photovoltaic device according to claim 23 wherein the second perovskite is a perovskite compound of formula (IB):

$$[A][B][X]_3 \qquad (IB)$$

wherein:
[A] is at least one organic cation or at least one Group I metal cation;
[B] is at least one metal cation; and
[X] is at least one anion.

27. A photovoltaic device according to claim 26 wherein [A] comprises $Cs^+$.

28. A photovoltaic device according to claim 26 wherein [B] comprises $Pb^{2+}$ or $Sn^{2+}$.

29. A photovoltaic device according to claim 26 wherein [X] comprises a halide anion or a plurality of different halide anions.

30. A photovoltaic device according to claim 26 wherein the perovskite compound of formula IB is $CsPbI_3$ or $CsSnI_3$.

31. A photovoltaic device according to claim 26 wherein the perovskite compound of formula (IB) is $CsPbI_2Cl$, $CsPbICl_2$, $CsPbI_2F$, $CsPbIF_2$, $CsPbI_2Br$, $CsPbIBr_2$, $CsSnI_2Cl$, $CsSnICl_2$, $CsSnI_2F$, $CsSnIF_2$, $CsSnI_2Br$ or $CsSnIBr_2$.

32. A photovoltaic device according to claim 26 wherein
[X] is two or more different anions selected from halide anions and chalcogenide anions, with the proviso that the perovskite compound comprises at least one halide anion; and/or
[A] comprises an organic cation; and/or
[B] comprises a metal cation that is selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$.

33. A photovoltaic device according to claim 23 wherein the second perovskite comprises a first cation, a second cation, and said at least one halide anion.

34. A photovoltaic device according to claim 1 wherein the photoactive layer comprises a layer comprising said charge transporting material disposed on a layer comprising said porous material.

35. A photovoltaic device according to claim 1 wherein the compact layer comprises a metal oxide or a metal sulphide.

36. A photovoltaic device according to claim 1 wherein the compact layer comprises an oxide of titanium, tin, zinc, gallium, niobium, tantalum, zirconium, neodinium, palladium or cadmium, or a sulphide of zinc or cadmium.

37. A photovoltaic device according to claim 1 wherein the compact layer comprises:
a p-type semiconductor comprising an oxide of nickel, vanadium, or copper; or
an oxide of tungsten or molybdenum.

38. A photovoltaic device according to claim 1 which further comprises an additional layer, disposed between the compact layer and the photoactive layer, which additional layer comprises a metal oxide or a metal chalcogenide which is the same as or different from the metal oxide or a metal chalcogenide employed in the compact layer.

39. A photovoltaic device according to claim 38 wherein the additional layer comprises alumina, magnesium oxide, cadmium sulphide, silicon dioxide or yttrium oxide.

\* \* \* \* \*